United States Patent
Sato

(10) Patent No.: US 6,727,039 B2
(45) Date of Patent: Apr. 27, 2004

(54) POSITIVE PHOTORESIST COMPOSITION

(75) Inventor: Kenichiro Sato, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 132 days.

(21) Appl. No.: 09/960,343

(22) Filed: Sep. 24, 2001

(65) Prior Publication Data

US 2002/0064727 A1 May 30, 2002

(30) Foreign Application Priority Data

Sep. 25, 2000 (JP) .................................. P. 2000-290654
Sep. 28, 2000 (JP) .................................. P. 2000-296881

(51) Int. Cl.$^7$ .............................................. G03F 7/004
(52) U.S. Cl. ............................. 430/270.1; 430/281.1; 430/905; 430/910; 525/105
(58) Field of Search .......................... 430/281.1, 270.1, 430/910, 905, 919, 917, 918

(56) References Cited

U.S. PATENT DOCUMENTS

| | | | | |
|---|---|---|---|---|
| 6,207,342 B1 | * | 3/2001 | Takechi et al. | 430/270.1 |
| 6,291,130 B1 | * | 9/2001 | Kodama et al. | 430/270.1 |
| 6,475,699 B2 | * | 11/2002 | Uetani et al. | 430/270.1 |
| 6,492,091 B2 | * | 12/2002 | Kodama et al. | 430/270.1 |
| 6,495,306 B2 | * | 12/2002 | Uetani et al. | 430/270.1 |

FOREIGN PATENT DOCUMENTS

| | | | | | |
|---|---|---|---|---|---|
| JP | 09090637 A | * | 4/1997 | | G03F/7/039 |
| JP | 10207069 A | * | 8/1998 | | G03F/7/039 |
| JP | 10274852 A | * | 10/1998 | | G03F/7/039 |

* cited by examiner

Primary Examiner—Mark F. Huff
Assistant Examiner—Yvette C. Thornton
(74) Attorney, Agent, or Firm—Sughrue Mion, PLLC

(57) ABSTRACT

A positive photoresist composition comprises (A) a resin containing a specific repeating structural unit such as norbornene structure, the resin being capable of increasing the solution velocity in an alkali developer by the action of acid; and (B) a compound capable of generating an acid by irradiation with one of an actinic ray and radiation.

15 Claims, No Drawings

POSITIVE PHOTORESIST COMPOSITION

FIELD OF THE INVENTION

The present invention relates to a positive resist composition for use in ultra-micro-lithography processes, such as the manufacture of ultra LSI (large-scale integrated circuit) and high capacitance micro chips, and in other photo-fabrication processes. More specifically, the present invention relates to a positive photoresist composition which is improved in exposure margin.

BACKGROUND OF THE INVENTION

The integration of integrated circuits has been heightened more and more in recent years, and the process of ultra-fine pattern comprising line width of half a micrometer or less has been required in the manufacture of semiconductor substrates, such as ultra LSI. For satisfying the necessity, the wavelengths used in the exposure apparatus for photolithography have become short waves more and more, the use of short wavelength eximer laser rays (XeCl, KrF, ArF, etc.) of far ultraviolet rays has been discussed now.

Chemically amplified resists are used for the pattern formation of lithography in the above wavelength region.

In general, chemical amplification series resist compositions can be roughly classified into three kinds of a two component system, a two and a half component system and a three component system. A two component system is comprised of a compound which generates an acid by photolysis (hereinafter referred to as a photo-acid generating agent) and a binder resin. The binder resin is a resin having a group which is decomposed by the action of acid and increases the solubility of the resin in an alkali developer (an acid-decomposable group) in the molecule. A two and a half component system is comprised of the combination of the above two component system and a low molecular weight compound having an acid-decomposable group. A three component system is comprised of a photo-acid generating agent, an alkali-soluble resin and the above-described low molecular weight compound.

The chemical amplification series resist compositions are suitably used in photoresists for ultraviolet and far ultraviolet ray irradiation, but it is further necessary to deal with the required characteristics on use. A photoresist composition comprised of a (meth)acrylate resin which is less absorptive than a partially hydroxylated styrene resin in combination with a compound which generates an acid by light is suggested as the photoresist compositions for ArF light sources.

Such photoresist compositions are disclosed, e.g., in JP-A-7-199467 (the term "JP-A" as used herein means an "unexamined published Japanese patent application") and JP-A-7-252324. A resin having a tertiary carbon organic group bonded to the oxygen of the carboxyl group of the acrylic acid by ester bonding is disclosed in JP-A-6-289615.

Acid-decomposable resins having an acrylic ester and a fumaric ester as repeating structural units are disclosed in JP-A-7-234511, but these resins are insufficient in pattern profiling or adhesion with a substrate, therefore, satisfactory performances are not obtained yet up to the present.

Since the light having a wavelength of 193 nm is often used as the exposure radiation in a lithographic process for producing the device using design rule of 0.18 $\mu$m and 0.13 $\mu$m or less, resist polymers not containing too much ethylenic unsaturated polymers are desired. Further, a resin having incorporated alicyclic hydrocarbon moiety is proposed for the purpose of giving dry etching resistance.

Resist polymers comprising an alkali-soluble group protected with the structure containing an alicyclic group and an acid-sensitive compound containing a structural unit capable of making the alkali-soluble group dissociate by acid to thereby bring into alkali-soluble are disclosed in JP-A-9-73173, JP-A-9-90637 and JP-A-10-161313.

Resist compositions containing an acid-decomposable resin having specific lactone structure are disclosed in JP-A-9-90637, JP-A-10-207069 and JP-A-10-274852.

Although the techniques disclosed in JP-A-10-10739 and JP-A-10-307401 are improved in transparency to the light of wavelength of 193 nm, sensitivity is not necessarily high and resist performances, e.g., resolution, are insufficient in lithography of 0.13 $\mu$m or less.

A chemical amplification series resist composition containing a terpolymer having a specific repeating structural unit having a norbornene structure at the backbone chain is disclosed in JP-A-10-130340.

A resin containing a repeating structural unit having an adamantane structure at the backbone chain and a maleic anhydride as the repeating structural unit is disclosed in JP-A-11-305444.

In these chemical amplification series resist compositions, however, the further improvements of characteristics such as an adhering property, an exposure margin and the fluctuations of sensitivity with the lapse of time have been desired.

SUMMARY OF THE INVENTION

Accordingly, an object of the present invention is to provide a positive photoresist composition excellent in an adhering property, an exposure margin (in particular, the exposure margin of an isolated line) and the fluctuations of sensitivity with the lapse of time in the manufacture of a semiconductor device.

Another object of the present invention is to provide a positive photoresist composition excellent in storage stability.

A further object of the present invention is to provide a positive photoresist composition which hardly generates development defects.

As a result of eager investigations of the materials constituting chemical amplification series positive photoresist compositions, the present inventors have found that the above objects of the present invention can be achieved by an acid-decomposable resin having a repeating structural unit of a specific structure, thus the present invention has been attained.

That is, the above objects of the present invention can be achieved by the following means.

(1) A positive photoresist composition comprising:

(A) a resin containing a repeating structural unit represented by formula (I) below and at least one of repeating structural units represented by formulas (IIa), (IIb) and (IIc) below, the resin being capable of increasing the solubility in an alkali developer by the action of acid; and (B) a compound capable of generating an acid by irradiation with one of an actinic ray and radiation:

(I)

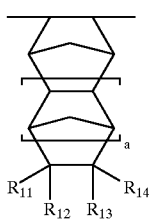

wherein $R_{11}$, $R_{12}$, $R_{13}$ and $R_{14}$ each represents a hydrogen atom or an alkyl group; and a represents 0 or 1;

(IIa)

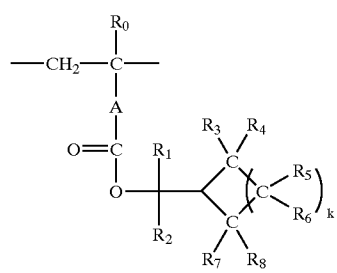

(IIb)

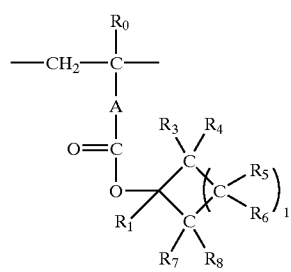

(IIc)

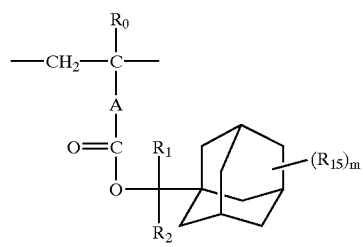

wherein $R_0$ represents a hydrogen atom or a lower alkyl group; A represents a single bond, or a group or combination of two or more groups selected from the group consisting of an alkylene group, a cycloalkylene group, an ether group, a thioether group, a carbonyl group and an ester group; $R_1$ and $R_2$ each represents a lower alkyl group; $R_3$, $R_4$, $R_5$, $R_6$, $R_7$ and $R_8$ each represents a hydrogen atom, a lower alkyl group, a lower alkoxyl group or a halogen atom; $R_3$ and $R_4$, or $R_5$ and $R_6$, may form a carbonyl group together; and $R_3$ and $R_5$ may be linked to form an alkylene chain; k and l each represents an integer of from 2 to 5; $R_{15}$ represents a lower alkyl group, a lower alkoxyl group or a halogen atom; and m represents an integer of from 0 to 3.

(2) The positive photoresist composition as described in item (1), wherein the resin (A) further contains a repeating structural unit represented by formula (III):

(III)

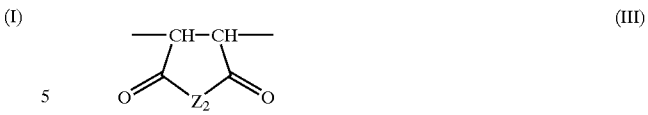

wherein $Z_2$ represents —O— or —N($R_{31}$)—; $R_{31}$ represents a hydrogen atom, a hydroxyl group, a haloalkyl group, or an —OSO$_2$—$R_{32}$ group; and $R_{32}$ represents an alkyl group, a haloalkyl group, a cycloalkyl group or a camphor residue.

(3) The positive photoresist composition as described in item (1), wherein the resin (A) further contains a repeating structural unit represented by formula (IV):

(IV)

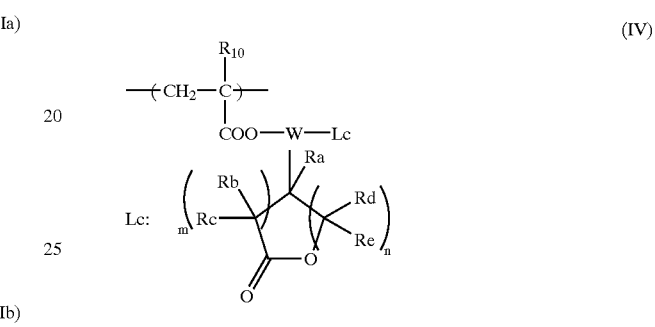

wherein $R_{10}$ represents a hydrogen atom or a methyl group; W represents a single bond, or a group or combination of two or more groups selected from the group consisting of an alkylene group, an ether group, a thioether group, a carbonyl group and an ester group; Ra, Rb, Rc, Rd and Re each represents a hydrogen atom or an alkyl group having from 1 to 4 carbon atoms; and m and n each represents an integer of from 0 to 3, and m+n is from 2 to 6.

(4) The positive photoresist composition as described in item (1), wherein the resin (A) further contains a repeating structural unit represented by formula (V):

(V)

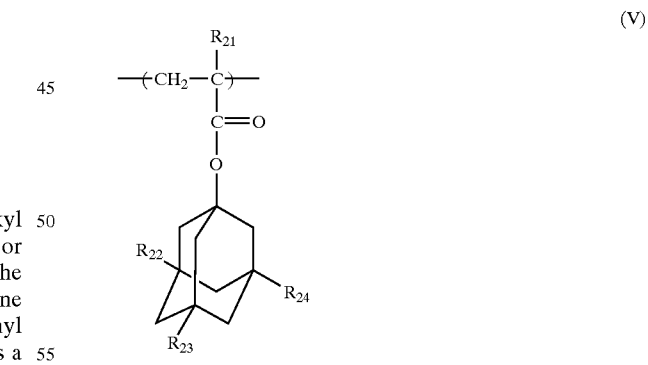

wherein $R_{21}$ represents a hydrogen atom, a halogen atom, or a straight chain or branched alkyl group having from 1 to 4 carbon atoms; and $R_{22}$, $R_{23}$ and $R_{24}$ each represents a hydrogen atom or a hydroxyl group; at least one of $R_{22}$, $R_{23}$ and $R_{24}$ represents a hydroxyl group.

(5) The positive photoresist composition as described in item (1), wherein the compound (B) comprises at least one of compounds represented by formula (I'), (II') and (III') below, which are capable of generating a sulfonic acid by irradiation with one of an actinic ray and radiation:

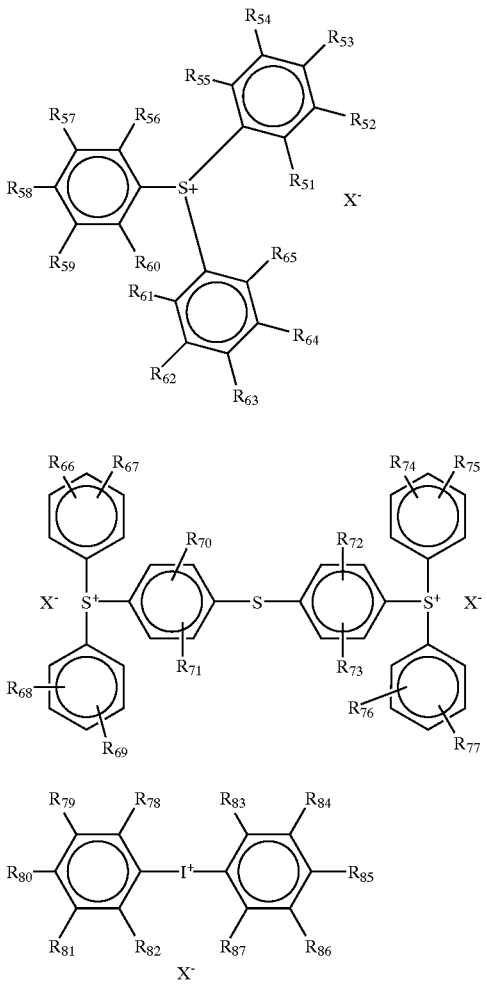

wherein $R_{51}$ to $R_{87}$, which are the same or different, each represents a hydrogen atom, a straight chain, branched or cyclic alkyl group, a straight chain, branched or cyclic alkoxyl group, a hydroxyl group, a halogen atom or an —S—$R_{88}$ group; $R_{88}$ represents a straight chain, branched or cyclic alkyl group or an aryl group; two or more of $R_{51}$ to $R_{65}$ may be bonded to form a ring containing at least one selected from a single bond, carbon, oxygen, sulfur and nitrogen; two or more of $R_{66}$ to $R_{77}$ may be bonded to form a ring containing at least one selected from a single bond, carbon, oxygen, sulfur and nitrogen; two or more of $R_{78}$ to $R_{87}$ may be bonded to form a ring containing at least one selected from a single bond, carbon, oxygen, sulfur and nitrogen; $X^-$ represents $R^FSO_3^-$; $R^F$ represents a straight chain, branched or cyclic alkyl group that has 2 or more carbon atoms and is substituted with at least one fluorine atom.

(6) The positive photoresist composition as described in item (1), which further comprises (D) an organic basic compound.

(7) The positive photoresist composition as described in item (1), which further comprises (E) a surfactant containing at least one of a fluorine atom and a silicon atom.

(8) The positive photoresist composition as described in item (1), wherein the resin (A) comprises the repeating structural unit represented by formula (I) in an amount of from 25 to 70 mol % based on the entire repeating unit in the resin (A).

(9) The positive photoresist composition as described in item (1), wherein the resin (A) comprises the at least one of repeating structural units represented by formula (IIa), (IIb) and (IIc) in a total amount of from 10 to 50 mol % based on the entire repeating unit in the resin (A).

(10) The positive photoresist composition as described in item (2), wherein the resin (A) comprises the repeating structural unit represented by formula (III) in an amount of from 20 to 80 mol % based on the entire repeating unit in the resin (A).

(11) The positive photoresist composition as described in item (3), wherein the resin (A) comprises the repeating structural unit represented by formula (IV) in an amount of from 1 to 30 mol % based on the entire repeating unit in the resin (A).

(12) The positive photoresist composition as described in item (4), wherein the resin (A) comprises the repeating structural unit represented by formula (V) in an amount of from 1 to 30 mol % based on the entire repeating unit in the resin (A).

(13) The positive photoresist composition as described in item (1), which comprises the resin (A) in an amount of from 40 to 99.99 wt % based on the entire solid content of the composition.

(14) The positive photoresist composition as described in item (5), wherein $R^FSO_3^-$ represents $CF_3(CF_2)_ySO_3^-$, and y represents an integer of from 1 to 15.

(15) The positive photoresist composition as described in item (5), which comprises the at least one of compounds represented by formula (I'), (II') and (III') in a total amount of from 0.001 to 20 wt % based on the entire solid content of the composition.

DETAILED DESCRIPTION OF THE INVENTION

The components for use in the present invention are described in detail below.

[1] (A) Resin Capable of Increasing the Solubility (the Dissolution Rate) in Alkali Developer by the Action of Acid (Hereinafter Referred to as Acid-Decomposable Resin)

In formula (I) which stands for the repeating structural unit of an acid-decomposable resin, $R_{11}$, $R_{12}$, $R_{13}$ and $R_{14}$ each represents a hydrogen atom or an alkyl group.

The alkyl group represented by $R_{11}$, $R_{12}$, $R_{13}$ and $R_{14}$ preferably has from 1 to 12, more preferably from 1 to 10, carbon atoms (e.g., methyl, ethyl, propyl, isopropyl, n-butyl, isobutyl, sec-butyl, t-butyl, pentyl, hexyl, heptyl, octyl, nonyl, decyl). The alkyl group represented by $R_{11}$, $R_{12}$, $R_{13}$ and $R_{14}$ may have a substituent, e.g., a hydroxyl group, an alkoxyl group, and an alkoxyalkoxy group, can be exemplified, and these substituents preferably have 4 or less carbon atoms.

In formula (I), a represents 0 or 1.

The specific examples of the repeating units represented by formula (I) are shown below, but it should not be construed as the present invention is limited thereto.

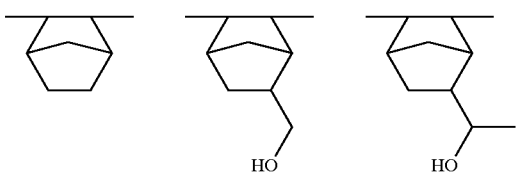

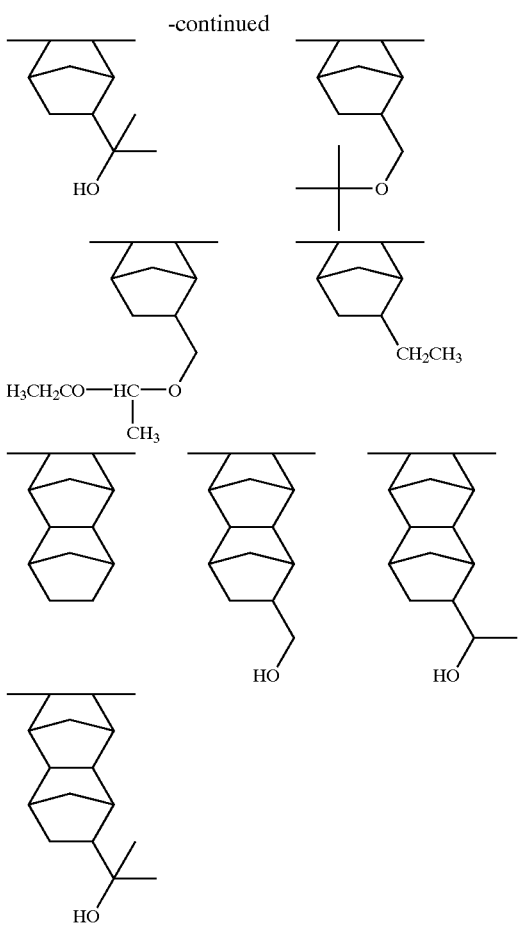

In formulae (IIa), (IIb) and (IIc), $R_0$ preferably represents a hydrogen atom.

The lower alkyl group represented by $R_0$, $R_1$, $R_2$, $R_3$, $R_4$, $R_5$ $R_6$, $R_7$, $R_8$ and $R_{15}$ is an alkyl group having from 1 to 6, preferably from 1 to 4 carbon atoms (e.g., methyl, ethyl, straight chain or branched propyl, straight chain or branched butyl).

The lower alkoxyl group represented by $R_3$, $R_4$, $R_5$, $R_6$, $R_7$, $R_8$ and $R_{15}$ is an alkoxyl group having from 1 to 6, preferably from 1 to 4 carbon atoms (e.g., methoxy, ethoxy, straight chain or branched propoxy, straight chain or branched butoxy).

The lower alkyl group represented by $R_0$, $R_1$, $R_2$, $R_3$, $R_4$, $R_5$, $R_6$, $R_7$, $R_8$ and $R_{15}$ and the lower alkoxyl group represented by $R_3$, $R_4$, $R_5$, $R_6$, $R_7$, $R_8$ and $R_{15}$ may have a substituent, e.g., a halogen atom (e.g., chlorine, bromine), an alkoxyl group (e.g., methoxy, ethoxy, preferably having from 1 to 3 carbon atoms).

As the alkylene group represented by A, a group represented by the following formula can be exemplified:

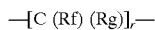

wherein Rf and Rg, which may be the same or different, each represents a hydrogen atom, an alkyl group, a substituted alkyl group, a halogen atom, a hydroxyl group, or an alkoxyl group. As the alkyl group, a lower alkyl group is preferred (e.g., methyl, ethyl, propyl, isopropyl, butyl, more preferably methyl, ethyl, propyl and isopropyl). As the substituents of the substituted alkyl group, a hydroxyl group, a halogen atom, and an alkoxyl group (preferably having from 1 to 4 carbon atoms) can be exemplified. As the alkoxyl group, those having from 1 to 4 carbon atoms (e.g., methoxy, ethoxy, propoxy, butoxy) can be exemplified. As the halogen atom, chlorine, bromine, fluorine and iodine can be exemplified. r represents an integer of from 1 to 10, preferably from 1 to 4.

As the cycloalkylene group represented by A, those having from 3 to 10 carbon atoms (e.g., cyclopentylene, cyclohexylene, cyclooctylene) can be exemplified.

$R_3$ and $R_4$, or $R_5$ and $R_6$ may form a carbonyl group together.

k and l each preferably represents an integer of from 2 to 4, more preferably 2 or 3. m represents an integer of from 0 to 3, preferably from 0 to 2.

As the alkylene chain which may be formed by $R_3$ and $R_5$, those preferably having 3 or less carbon atoms, e.g., a methylene chain, an ethylene chain, and a propylene chain can be exemplified.

Of the repeating structural units represented by formulae (IIa), (IIb) and (IIc), the repeating structural unit represented by formula (IIa) is preferred.

The specific examples of the repeating structural units represented by formulae (IIa), (IIb) and (IIc) are shown below but it should not be construed as the present invention is limited thereto.

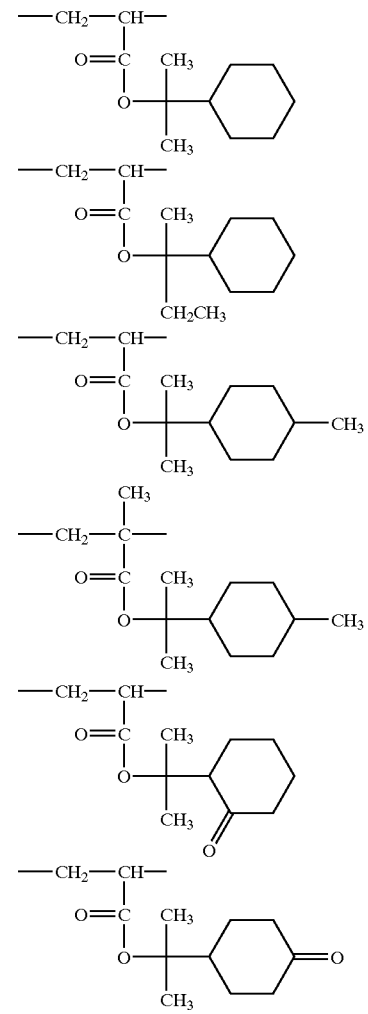

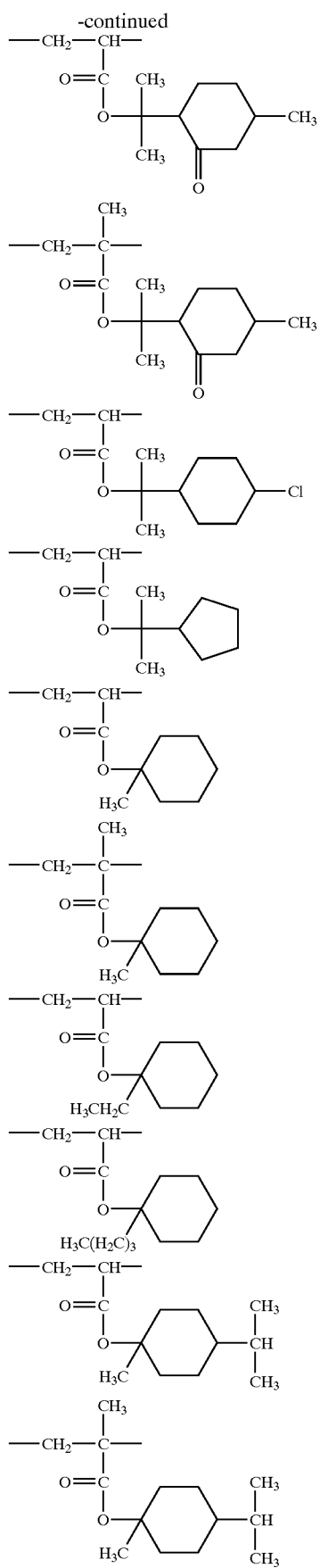
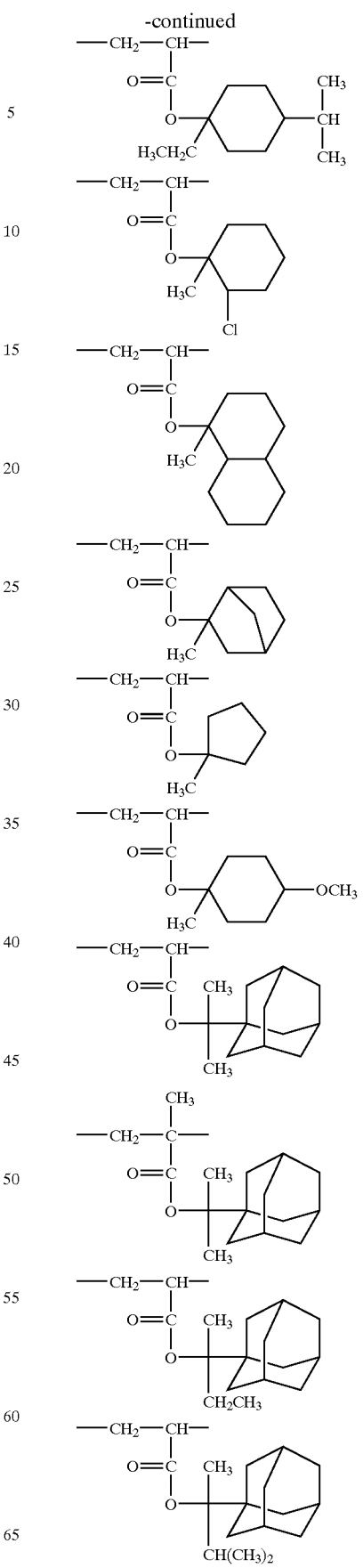

-continued

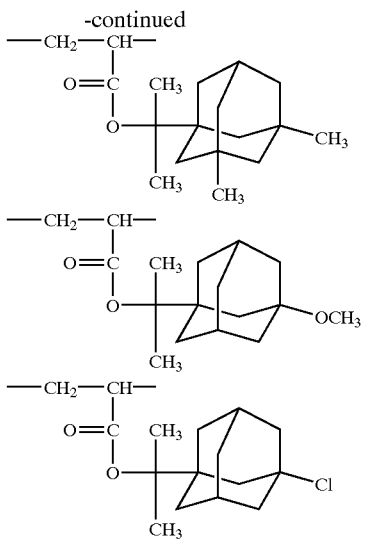

It is preferred that acid-decomposable resin (A) according to the present invention further contain a repeating unit represented by formula (III), by which an adhering property and a resolution are improved.

In formula (III), $Z_2$ represents —O— or —N($R_{31}$)—, where $R_{31}$ represents a hydrogen atom, a haloalkyl group, a hydroxyl group, or an —O—$SO_2$—$R_{32}$ group, and $R_{32}$ represents an alkyl group, a haloalkyl group, a cycloalkyl group or a camphor residue.

The alkyl group represented by $R_{32}$ is preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl or t-butyl.

As the haloalkyl group represented by $R_{32}$, a trifluoromethyl group, a nanofluorobutyl group, a pentadecafluorooctyl group and a trichloromethyl group can be exemplified.

As the cycloalkyl group represented by $R_{32}$, a cyclopentyl group, a cyclohexyl group and a cyclooctyl group can be exemplified.

The specific examples of the repeating structural unit represented by formula (III) are shown below but the present invention is not limited thereto.

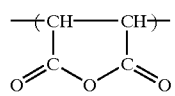 [III-1]

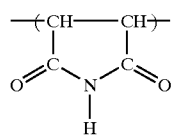 [III-2]

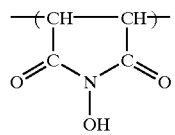 [III-3]

-continued

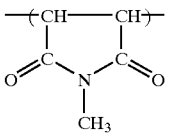 [III-4]

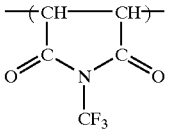 [III-5]

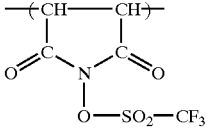 [III-6]

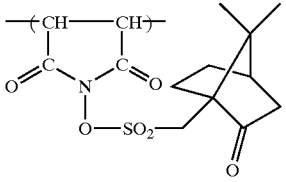 [III-7]

It is still more preferred that resin (A) have the repeating structural unit represented by formula (IV) or (V), by which the adhesion to an inorganic anti-reflecting coating is improved, i.e., peeling of a pattern can be prevented.

In formula (IV) which denotes a repeating structural unit of the acid-decomposable resin, $R_{10}$ represents a hydrogen atom or a methyl group.

Ra, Rb, Rc, Rd and Re each represents a hydrogen atom or an alkyl group having from 1 to 4 carbon atoms. m and n each represents an integer of from 0 to 3, provided that m+n is from 2 to 6.

As the alkyl group having from 1 to 4 carbon atoms represented by Ra, Rb, Rc, Rd and Re, methyl, ethyl, propyl, isopropyl, n-butyl, isobutyl, sec-butyl and t-butyl can be exemplified.

The alkyl group having from 1 to 4 carbon atoms represented by Ra, Rb, Rc, Rd and Re may be substituted, and the examples of the substituents include a carboxyl group, an acyloxy group, a cyano group, a halogen atom, a hydroxyl group, an alkoxyl group, a substituted alkoxyl group, an acetylamido group, an alkoxycarbonyl group, and an acyl group. These substituents preferably have from 1 to 4 carbon atoms.

As the acyloxy group, acetoxy can be exemplified. The examples of the halogen atoms include chlorine, bromine, fluorine and iodine. As the alkoxyl group, alkoxyl groups having from 1 to 4 carbon atoms, e.g., methoxy, ethoxy, propoxy, butoxy, can be exemplified. As the substituent of the substituted alkoxyl group, an alkoxyl group can be exemplified.

The alkylene group represented by W in formula (IV) has the same meaning as the alkylene group represented by A in the above-described formulae (IIa), (IIb) and (IIc).

The specific examples of the repeating structural unit represented by formula (IV) are shown below but it should not be construed as the present invention is limited thereto.

(IV-1) 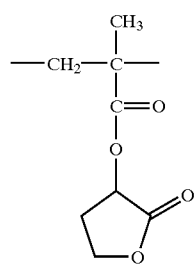
(IV-2) 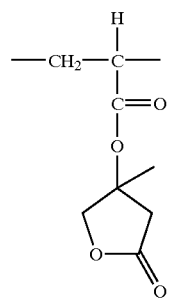
(IV-3) 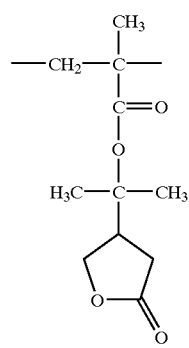
(IV-4) 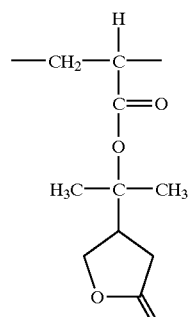
(IV-5) 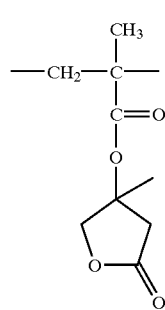
(IV-6) 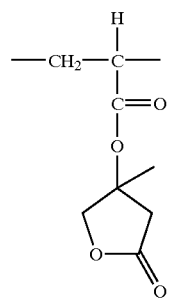
(IV-7) 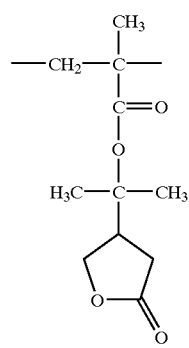
(IV-8) 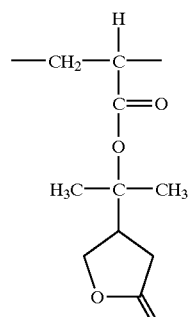
(IV-9) 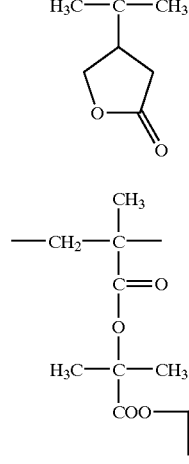
(IV-10) 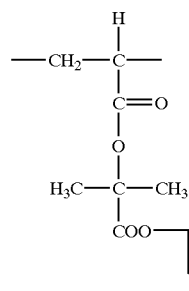

(IV-11) 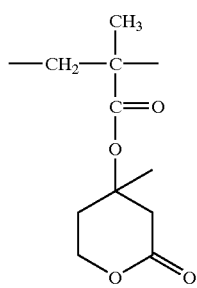
(IV-12) 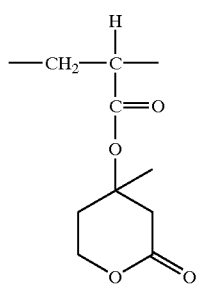
(IV-13) 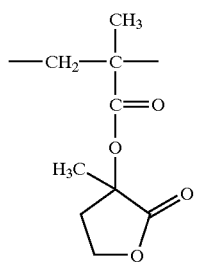
(IV-14) 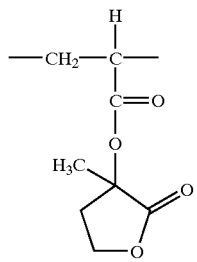
(IV-15) 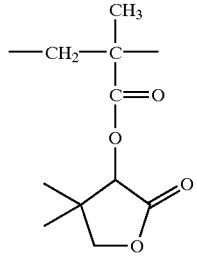
(IV-16) 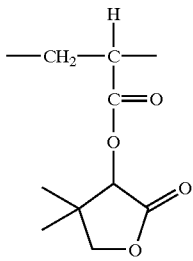
(IV-17) 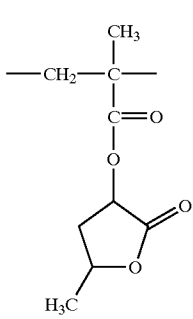
(IV-18) 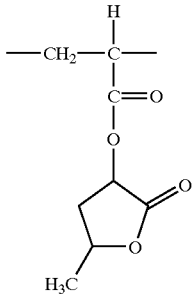
(IV-19) 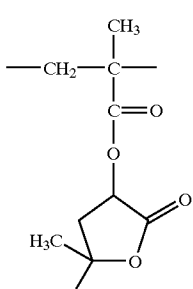
(IV-20) 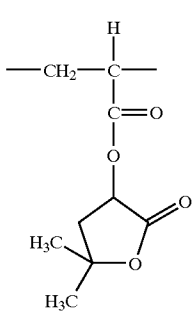

(IV-21) 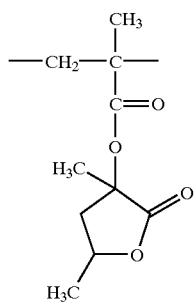
(IV-22) 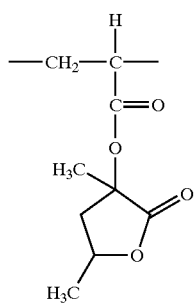
(IV-23) 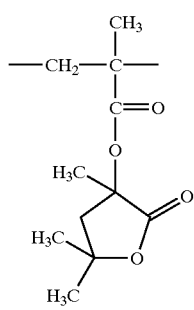
(IV-24) 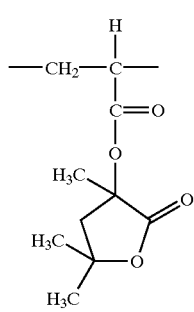
(IV-25) 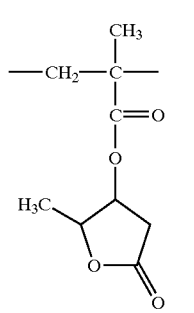
(IV-26) 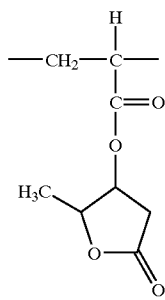
(IV-27) 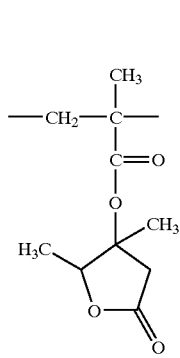
(IV-28) 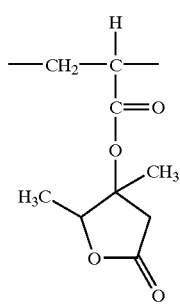
(IV-29) 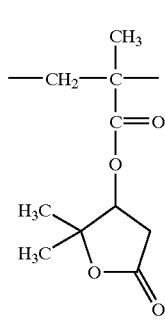
(IV-30) 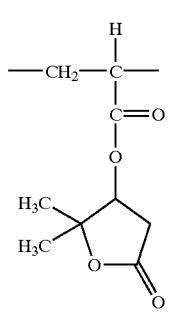

(IV-31) 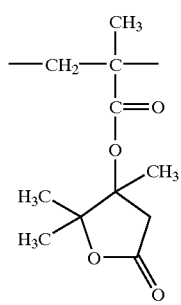

(IV-32) 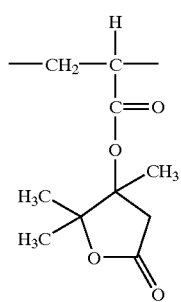

(IV-33) 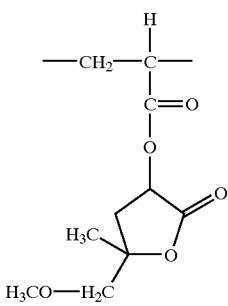

(IV-34) 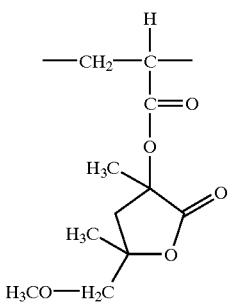

(IV-35) 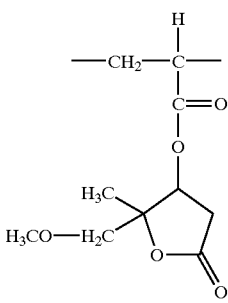

(IV-36) 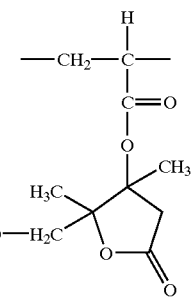

Of the above specific examples of formula (IV), formulae (IV-9), (IV-10), (IV-17) to (IV-36) are preferred from the point of capable of obtaining better exposure margin.

The structure of formula (IV) is preferably acrylate structure because good edge roughness can be obtained.

In the next place, the repeating unit represented by formula (V) is described below.

In formula (V), the alkyl group represented by $R_{21}$ is a straight chain or branched alkyl group having from 1 to 4 carbon atoms (e.g., methyl, ethyl, n-propyl, isopropyl, n-butyl, isobutyl, sec-butyl, t-butyl). The alkyl group may be substituted, and the examples of the substituents include an alkoxyl group (preferably having from 1 to 4 carbon atoms), a halogen atom (e.g., fluorine, chlorine, bromine, iodine), an acyl group (preferably having from 2 to 4 carbon atoms), an acyloxy group (preferably having from 2 to 4 carbon atoms), a cyano group, a hydroxyl group, a carboxyl group, an alkoxycarbonyl group (preferably having from 2 to 4 carbon atoms), and a nitro group.

The examples of the halogen atoms represented by $R_{21}$ include fluorine, chlorine, bromine and iodine.

As described above, at least one of $R_{22}$, $R_{23}$ and $R_{24}$ in formula (V) represents a hydroxyl group, and the adamantyl group in formula (V) is preferably a dihydroxy body or monohydroxy body, more preferably a monohydroxy body.

Acid-decomposable resin (A) can contain various kinds of repeating structural units besides the above-described repeating structural units for the purpose of improving a dry etching resistance, an aptitude to a standard developing solution, adhesion to a substrate, a resist profile, and the general characteristics required of the resist, e.g., a resolution, a heat resistance and sensitivity.

As such repeating structural units, the repeating structural units corresponding to the monomers shown below can be exemplified but the present invention is not limited thereto.

Due to containing these monomers, it becomes possible to finely adjust the characteristics required of acid-decomposable resins, in particular, the following characteristics.

(1) solubility in a coating solvent, (2) film-forming property (glass transition point), (3) alkali developability, (4) film decrease (hydrophilicity/hydrophobicity, selection of alkali-soluble groups), (5) adhesion to the substrate of an unexposed domain, and (6) dry etching resistance.

As such monomers, compounds having one addition polymerizable unsaturated bond selected from, e.g., acrylic esters, methacrylic esters, acrylamides, methacrylamides, allyl compounds, vinyl ethers and vinyl esters can be exemplified.

Specifically, the following monomers can be exemplified.

Acrylic Esters (Preferably an Alkyl Acrylate, wherein the Alkyl Group has from 1 to 10 the Carbon Atoms)

methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate, etc.

Methacrylic Esters (Preferably an Alkyl Methacrylate, wherein the Alkyl Group has from 1 to 10 the Carbon Atoms)

methyl methacrylate, ethyl methacrylate, propyl methacrylate, isopropylmethacrylate, amylmethacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate, etc.

Acrylamides acrylamide, N-alkylacrylamide (as the alkyl group, an alkyl group having from 1 to 10 carbon atoms, e.g., methyl, ethyl, propyl, butyl, t-butyl, heptyl, octyl, cyclohexyl, hydroxyethyl), N,N-dialkylacrylamide (as the alkyl group, an alkyl group having from 1 to 10 carbon atoms, e.g., methyl, ethyl, butyl, isobutyl, ethylhexyl, cyclohexyl), N-hydroxyethyl-N-methylacrylamide, N-2-acetamidoethyl-N-acetylacrylamide, etc.

Methacrylamides methacrylamide, N-alkylmethacrylamide (as the alkyl group, an alkyl group having from 1 to 10 carbon atoms, e.g., methyl, ethyl, t-butyl, ethylhexyl, hydroxyethyl, cyclohexyl), N,N-dialkylmethacrylamide (as the alkyl group, e.g., ethyl, propyl, butyl), N-hydroxyethyl-N-methylmethacrylamide, etc.

Allyl Compounds allyl esters (e.g., allyl acetate, allyl caproate, allyl caprylate, allyl laurate, allyl palmitate, allyl stearate, allyl benzoate, allyl acetoacetate, allyl lactate, etc.), allyloxyethanol, etc.

Vinyl Ethers alkyl vinyl ether, e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.

Vinyl Esters vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl acetoacetate, vinyl lactate, vinyl-β-phenylbutyrate, vinyl cyclohexylcarboxylate, etc.

Dialkyl Itaconates dimethyl itaconate, diethyl itaconate, dibutyl itaconate, etc.

Dialkyl Esters or Monoalkyl Esters of Fumaric Acid dibutyl fumarate, etc.

Others crotonic acid, itaconic acid, acrylonitrile, methacrylonitrile, maleylonitrile, etc.

Besides the above compounds, addition polymerizable unsaturated compounds copolymerizable with the monomers corresponding to the above various repeating structural units can be used.

In acid-decomposable resins, the molar ratio of the content of each repeating structural unit can be arbitrarily set for adjusting the dry etching resistance of a resist, an aptitude to a standard developing solution, adhesion to a substrate, a resist profile, and the general requisite of the resist, e.g., a resolution, a heat resistance and sensitivity.

The content of the repeating structural unit represented by formula (I) in acid-decomposable resin (A) is preferably from 25 to 70 mol % of the entire amount of the repeating structural units, more preferably from 28 to 65 mol %, and still more preferably from 30 to 60 mol %.

The total content of the repeating structural units represented by formula (IIa), (IIb) and (IIc) in acid-decomposable resin (A) is preferably from 10 to 50 mol % of the entire amount of the repeating structural units, more preferably from 12 to 35 mol %, and still more preferably from 15 to 30 mol %.

The content of the repeating structural unit represented by formula (III) in acid-decomposable resin (A) is preferably from 20 to 80 mol % of the entire amount of the repeating structural units, more preferably from 25 to 70 mol %, and still more preferably from 30 to 60 mol %.

The content of the repeating structural unit represented by formula (IV) in acid-decomposable resin (A) is preferably from 1 to 30 mol % of the entire amount of the repeating structural units, more preferably from 3 to 25 mol %, and still more preferably from 5 to 20 mol %.

The content of the repeating structural unit represented by formula (V) in acid-decomposable resin (A) is preferably from 1 to 30 mol % of the entire amount of the repeating structural units, more preferably from 3 to 25 mol %, and still more preferably from 5 to 20 mol %.

The content of the repeating structural units in acid-decomposable resin (A) other than the above-described repeating structural units represented by formulae (I) to (V) can also be arbitrarily set according to the characteristics of a desired resist, and the content is generally preferably 99 mol % or less of the total mol number of the repeating structural units represented by formulae (I) to (V), more preferably 90 mol % or less, and still more preferably 80 mol % or less. When the composition of the present invention is used for ArF exposure, it is preferred that the resin should not contain an aromatic ring in view of the transparency to ArF light.

The weight average molecular weight (Mw, measured by a GPC method, in terms of polystyrene) of acid-decomposable resin (A) is preferably from 1,000 to 1,000,000, more preferably from 1,500 to 500,000, still more preferably from 2,000 to 200,000, and most preferably from 2,500 to 100,000. The greater the molecular weight, the higher is the heat resistance but the developing property is deteriorated, thus the molecular weight is controlled taking the balance into consideration. The acid-decomposable resin for use in the present invention can be synthesized according to ordinary method (e.g., radical polymerization).

In the positive photoresist composition according to the present invention, the proportion of acid-decomposable resin (A) is preferably from 40 to 99.99 wt % based on the entire solid content of the composition, more preferably from 50 to 99.97 wt %.

The preferred specific examples of the combinations of the repeating structural units of acid-decomposable resin (A) are shown below.

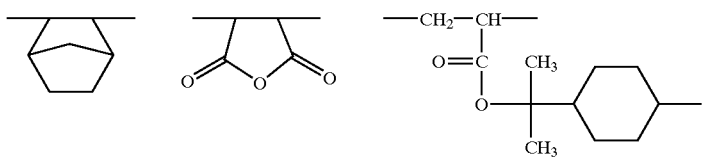
(1)
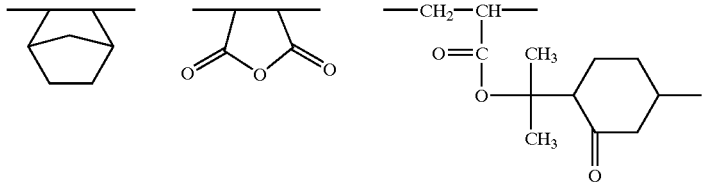
(2)
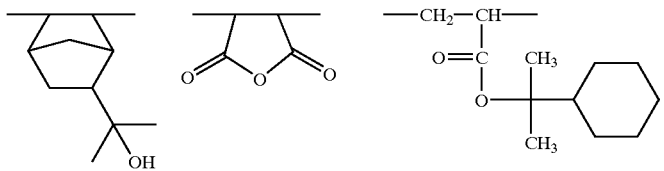
(3)
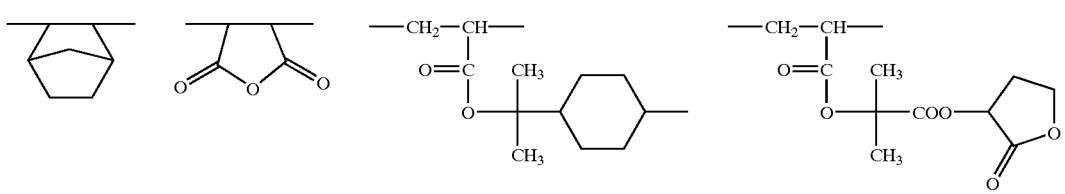
(4)
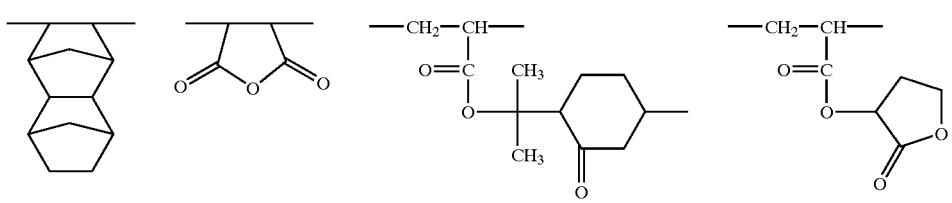
(5)
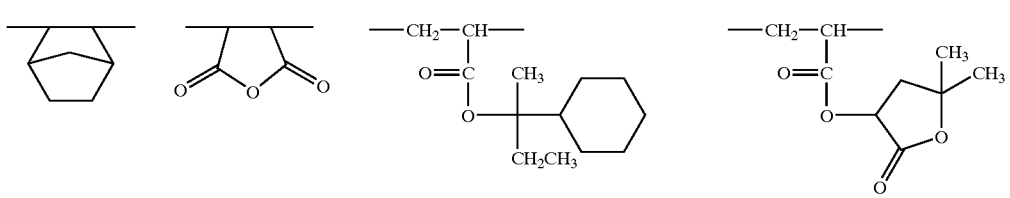
(6)
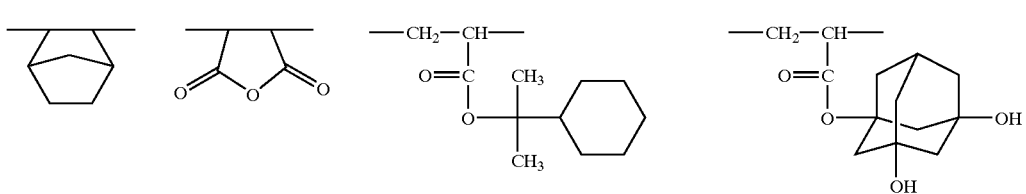
(7)
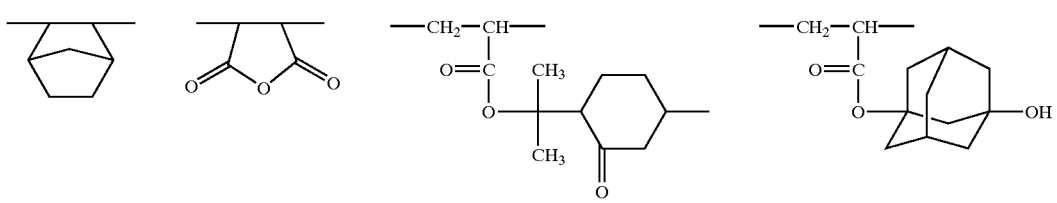
(8)

-continued
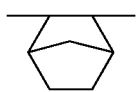 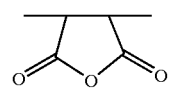 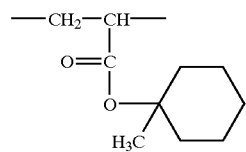 (9)
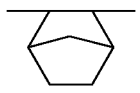 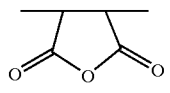 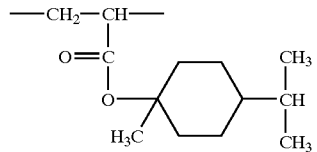 (10)
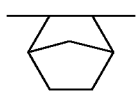 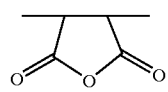 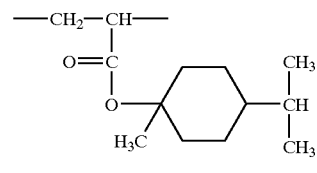 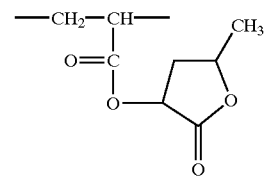 (11)
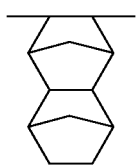 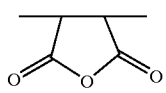 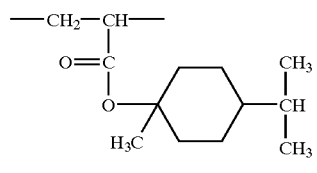 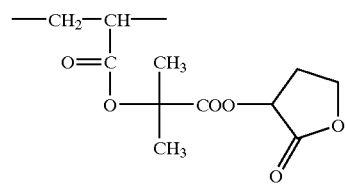 (12)
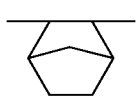 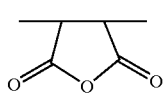 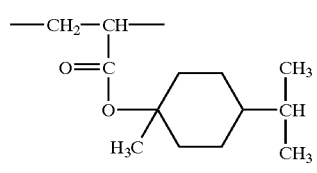 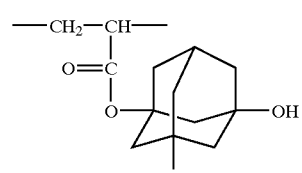 (13)
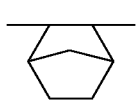 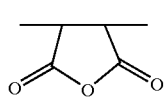 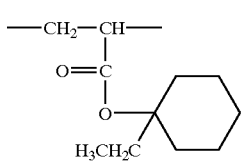 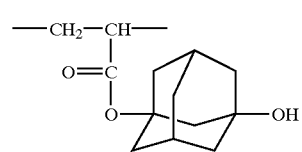 (14)
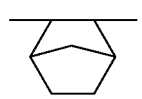 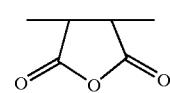 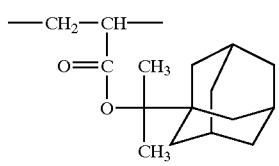 (15)
 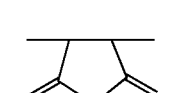 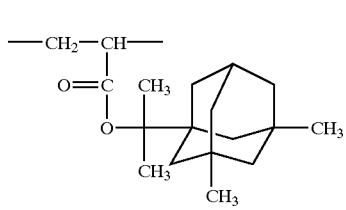 (16)

(17)

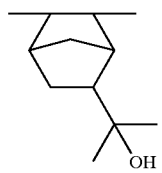 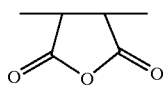 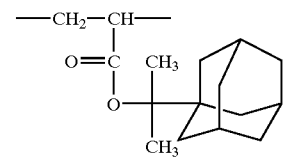

(18)

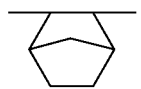 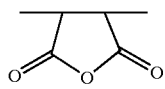 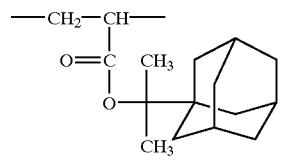 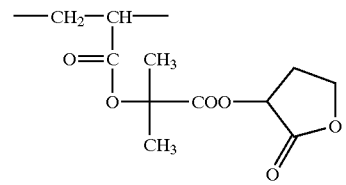

(19)

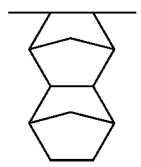 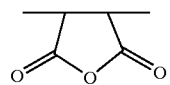 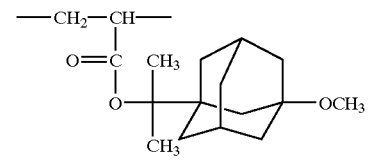 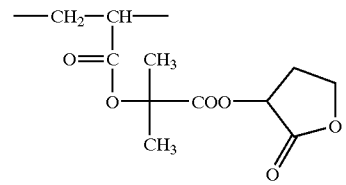

(20)

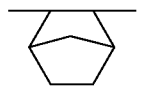 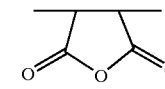 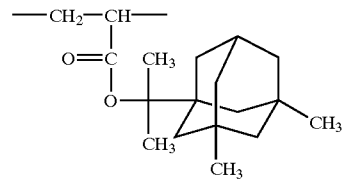 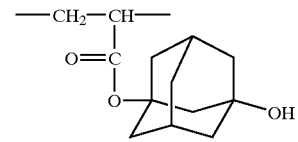

(21)

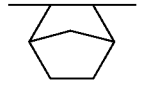 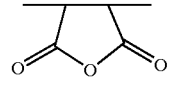 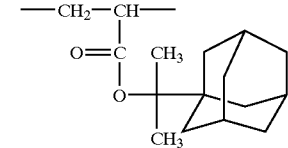 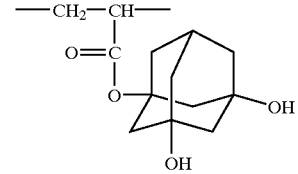

[2] (B) Compound Capable of Generating Acid by Irradiation with One of an Actinic Ray or Radiation (Photo-Acid Generating Agent)

The photo-acid generating agent for use in the present invention is a compound which generates an acid by irradiation with actinic rays or radiations.

The photo-acid generating agent can be appropriately selected from photo-cationic polymerization photo-initiators, photo-radical polymerization photo-initiators, photo-decoloring agents and photo-discoloring agents of dyes, and compounds which generate an acid by irradiation with well-known rays used in microresists, etc. (e.g., ultraviolet rays of from 200 to 400 nm, far ultraviolet rays, particularly preferably, g-rays, h-rays, i-rays, KrF eximer laser beams), ArF eximer laser beams, electron beams, X-rays, molecular beams or ion beams, and mixtures of these compounds.

In addition, as other photo-acid generating agents for use in the present invention, e.g., onium salts such as diazonium salts, ammonium salts, phosphonium salts, iodonium salts, sulfonium salts, selenonium salts, arsonium salts, etc., organic halogen compounds, organic metals/organic halogen compounds, photo-acid generating agents having an o-nitrobenzyl protective group, compounds which generate a sulfonic acid by photo-decomposition represented by iminosulfonate, disulfone compounds, diazoketosulfone compounds and diazodisulfone compounds can be exemplified.

Further, compounds having introduced these groups or compounds which generate an acid by irradiation into the backbone chains or side chains of polymers can also be used in the present invention.

Further, the light-acid generating compounds as described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and EP 126712 can also be used in the present invention.

Of the above-described compounds which generate an acid by irradiation with actinic rays or radiations, those particularly effectively used in the present invention are described below.

(1) An Oxazole Derivative Represented by the Following Formula (PAG1) Substituted with a Trihalomethyl Group or an S-Triazine Derivative Represented by Formula (PAG2)

(PAG1)

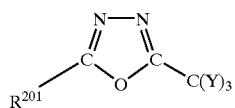

(PAG2)

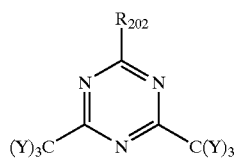

(PAG1-8)

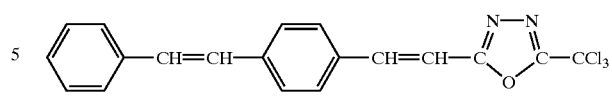

(PAG2-1)

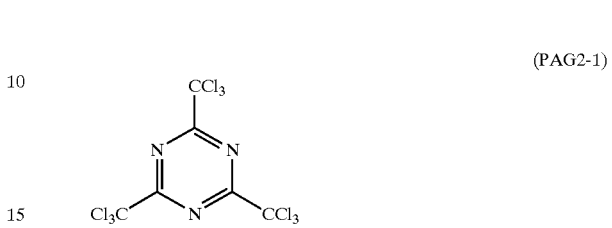

wherein $R^{201}$ represents a substituted or unsubstituted aryl group or alkenyl group; $R^{202}$ represents a substituted or unsubstituted aryl group, alkenyl group, alkyl group, or —C(Y)$_3$; and Y represents a chlorine atom or a bromine atom.

The specific examples of the compounds represented by formulae (PAG1) and (PAG2) are shown below but the present invention is not limited thereto.

(PAG2-2)

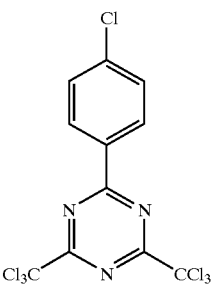

(PAG1-1)

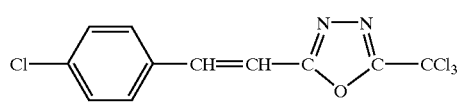

(PAG1-2)

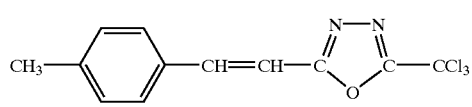

(PAG1-3)

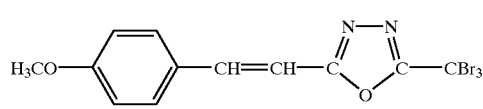

(PAG2-3)

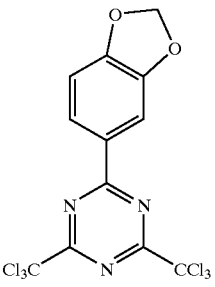

(PAG1-4)

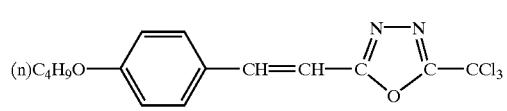

(PAG1-5)

(PAG2-4)

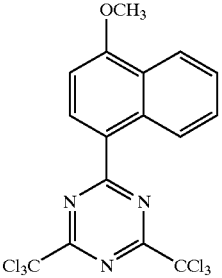

(PAG1-6)

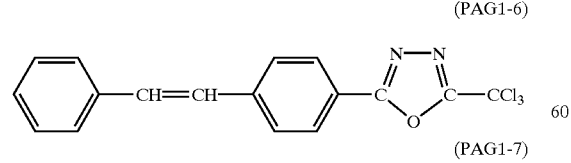

(PAG1-7)

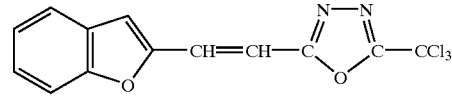

(PAG2-5)

-continued (PAG2-6)
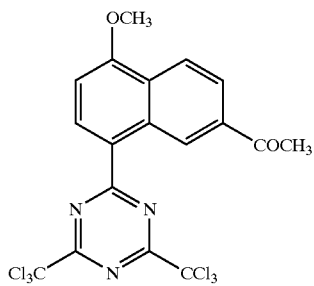

(PAG2-7)
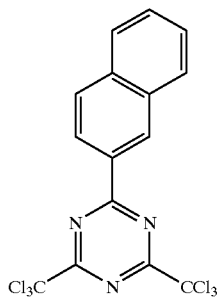

(PAG2-8)
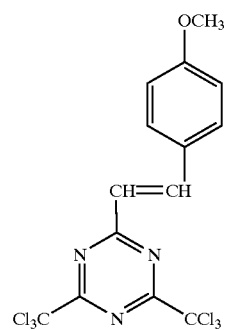

(PAG2-9)
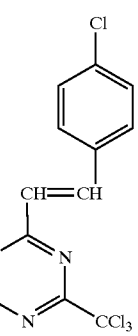

-continued (PAG2-10)
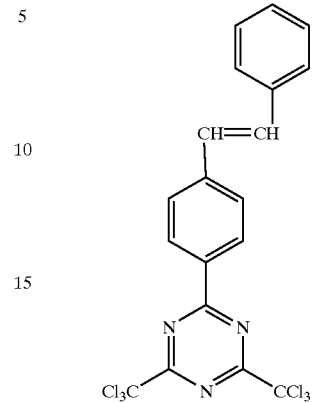

(2) An Iodonium Salt Represented by the Following Formula (PAG3) or a Sulfonium Salt Represented by Formula (PAG4)

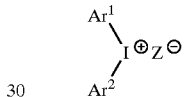
(PAG3)

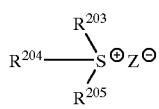
(PAG4)

wherein $Ar^1$ and $Ar^2$ each represents a substituted or unsubstituted aryl group.

$R^{203}$, $R^{204}$ and $R^{205}$ each represents a substituted or unsubstituted alkyl group or aryl group.

$Z^-$ represents a counter anion, e.g., $BF_4^-$, $AsF_6^-$, $PF_6^-$, $SbF_6^-$, $SiF_6^-$, $ClO_4^-$, $CF_3SO_3^-$, a condensed polynuclear aromatic sulfonic acid anion, such as a pentafluorobenzenesulfonic acid anion, and naphthalene-1-sulfonic acid anion, an anthraquinonesulfonic acid anion, and a sulfonic acid group-containing dye, but the present invention is not limited thereto.

Further, two of $R^{203}$, $R^{204}$ and $R^{205}$, and $Ar^1$ and $Ar^2$ may be bonded through respective single bonds or substituents.

The specific examples of the compounds represented by formulae (PAG3) and (PAG4) are shown below but the present invention is not limited thereto.

(PAG3-1)
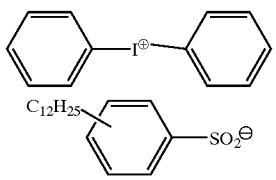

-continued
(PAG3-2)
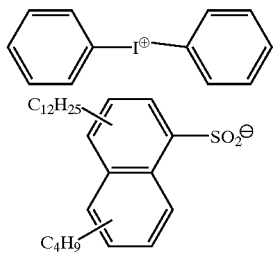
(PAG3-3)
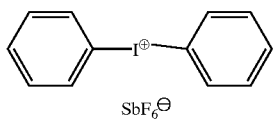
(PAG3-4)
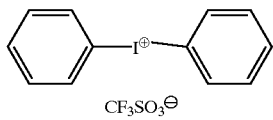
(PAG3-5)
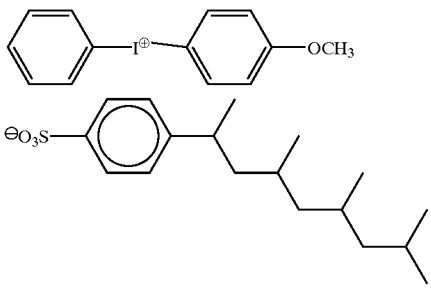
(PAG3-6)
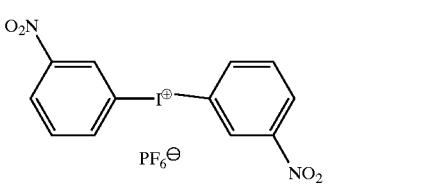
(PAG3-7)
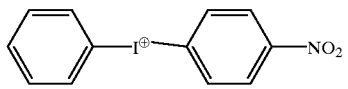
(PAG3-8)
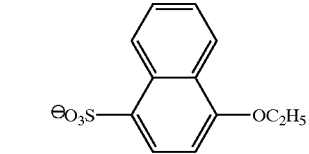
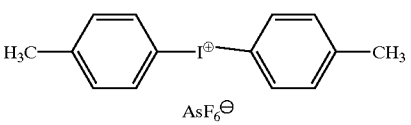
-continued
(PAG3-9)
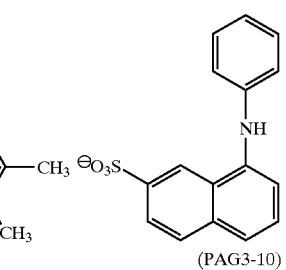
(PAG3-10)
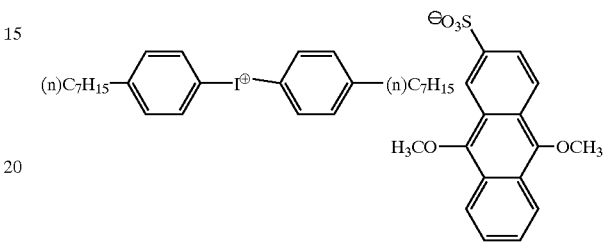
(PAG3-11)
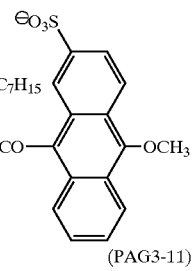
(PAG3-12)
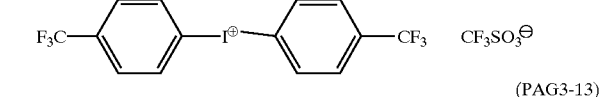
(PAG3-13)
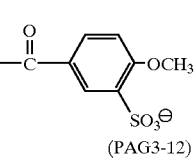
(PAG3-14)
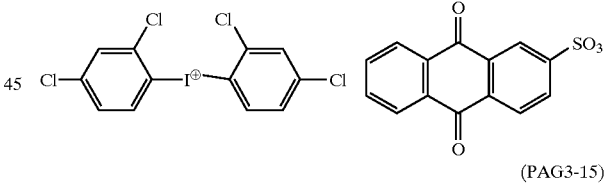
(PAG3-15)
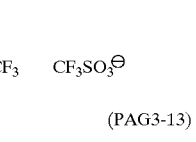
(PAG3-16)
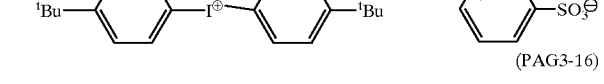
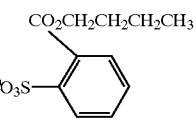
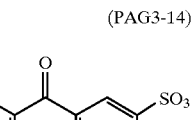
(PAG3-17)
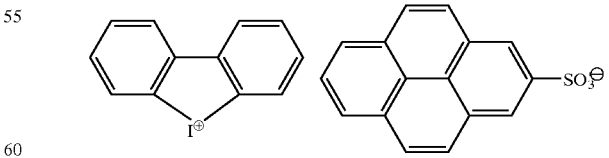
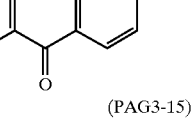
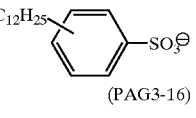

(PAG3-18)
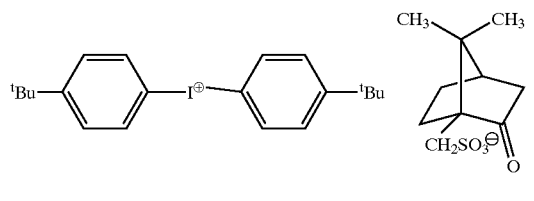
(PAG4-1)
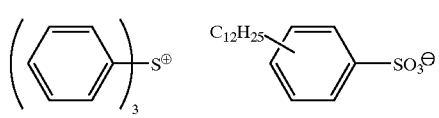
(PAG3-19)
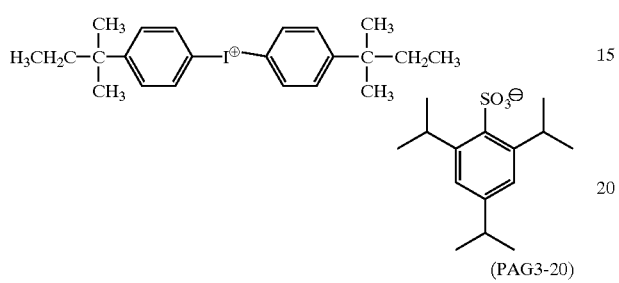
(PAG4-2)
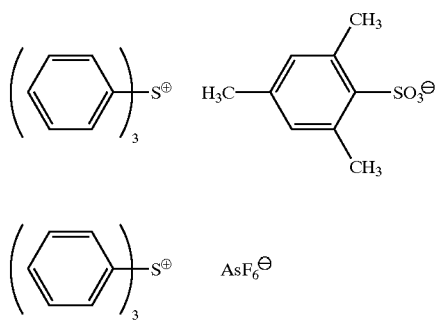
(PAG3-20)
(PAG4-3)
(PAG4-4)
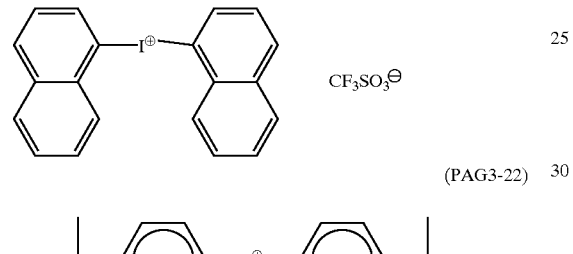
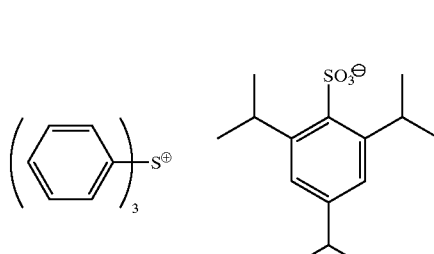
(PAG3-22)
(PAG4-5)
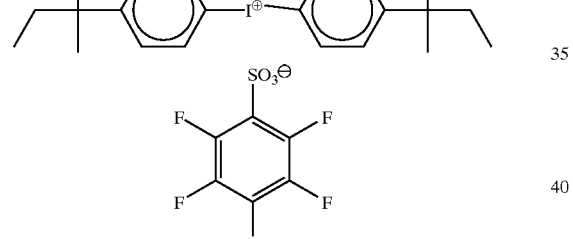
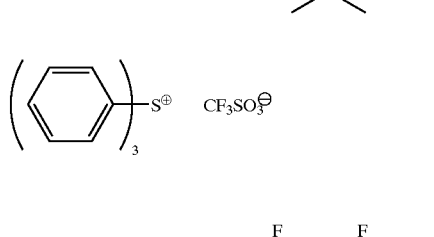
(PAG3-23)
(PAG4-7)
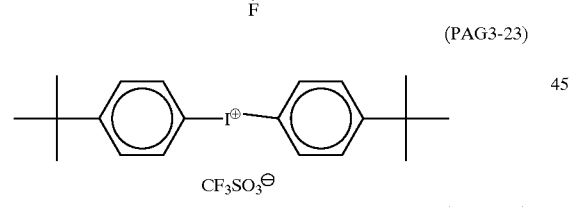
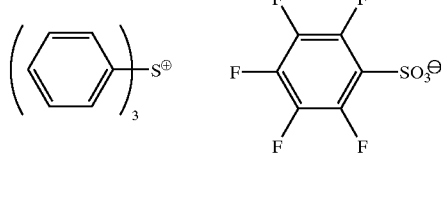
(PAG3-24)
(PAG4-8)
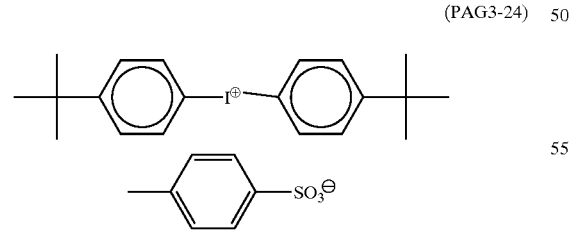
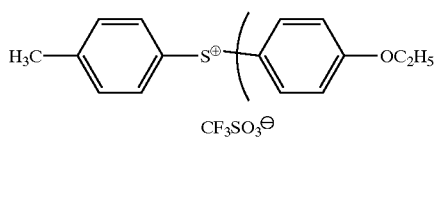
(PAG3-25)
(PAG4-9)
(PAG4-10)
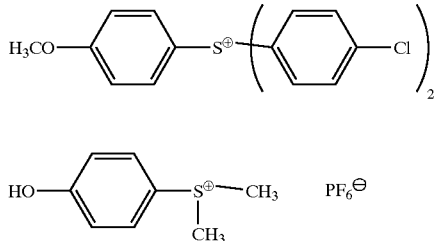

(PAG4-11) 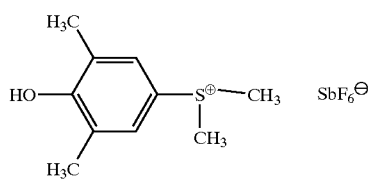
(PAG4-12) 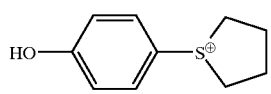 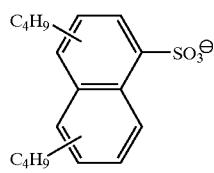
(PAG4-13) 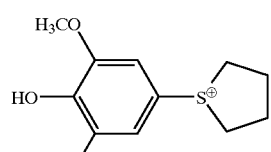
(PAG4-14) 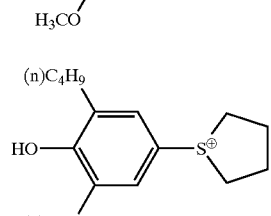
(PAG4-15) 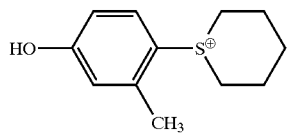
(PAG4-16) 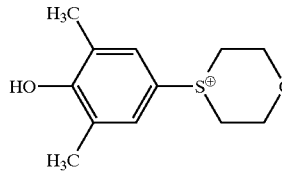
(PAG4-18) 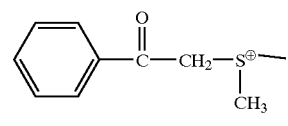
(PAG4-19) 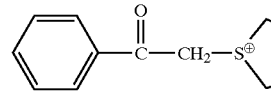
(PAG4-20) 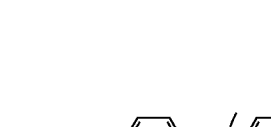 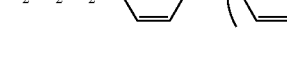
(PAG4-21) 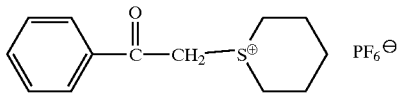
(PAG4-22) 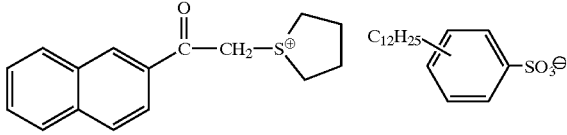
(PAG4-23) 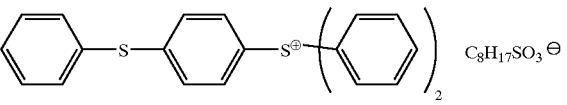
(PAG4-24) 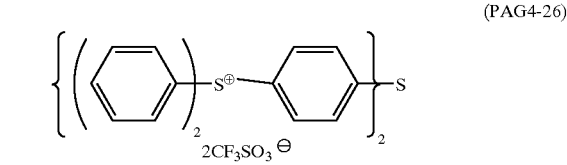
(PAG4-25) 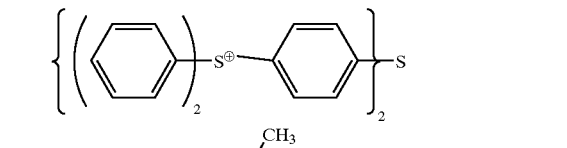
(PAG4-26) 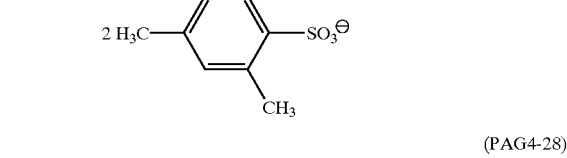
(PAG4-27) 
(PAG4-28) 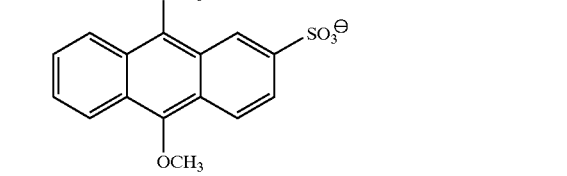

-continued
(PAG4-29)
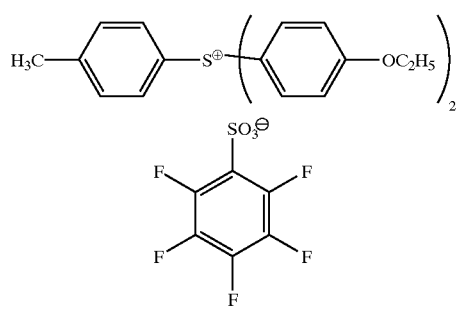
(PAG4-30)
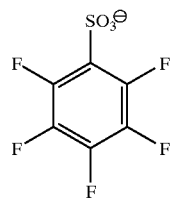
(PAG4-31)
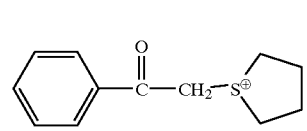
(PAG4-32)
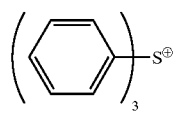 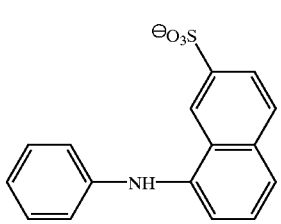
(PAG4-33)
 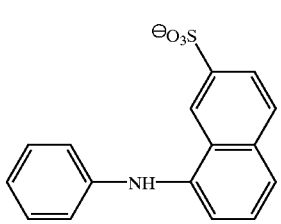
(PAG4-34)
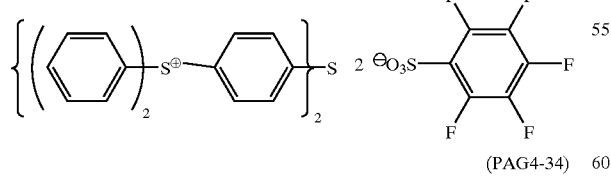
-continued
(PAG4-37)
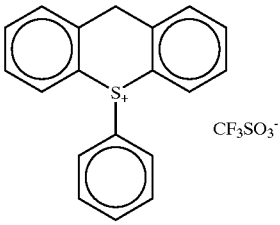
(PAG4-38)
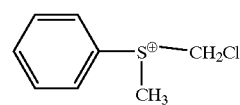
(PAG4-40)
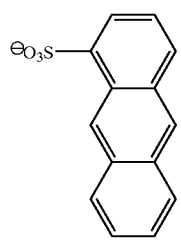
(PAG4-42)
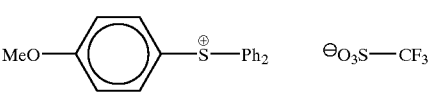
(PAG4-43)
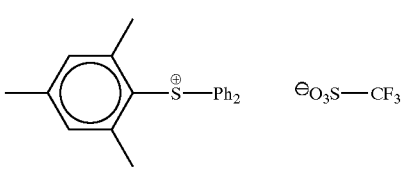
(PAG4-44)
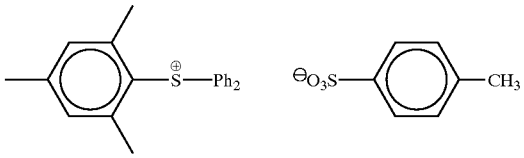
(PAG4-46)
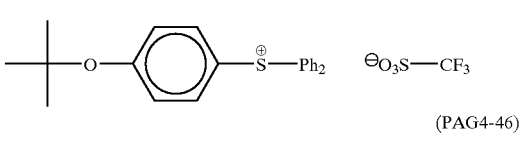
(PAG4-47)
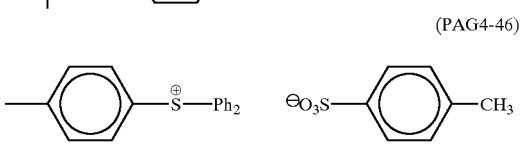
(PAG4-49)
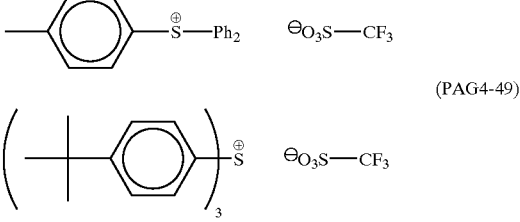
(PAG4-51)
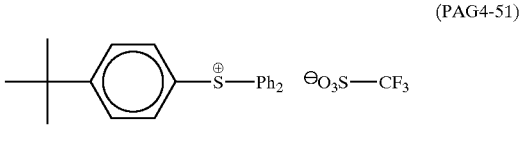

In the above formulae, Ph represents a phenyl group.

The above-described onium salts represented by formulae (PAG3) and (PAG4) are well-known compounds and they can be synthesized according to the methods described, e.g., in U.S. Pat. Nos. 2,807,648, 4,247,473, and JP-A-53-101331.

(3) A Disulfone Derivative Represented by the Following Formula (PAG5) or an Iminosulfonate Derivative Represented by Formula (PAG6)

(PAG5)

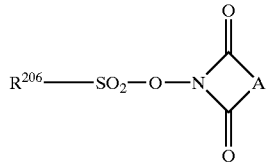

(PAG6)

wherein $Ar^3$ and $Ar^4$ each represents a substituted or unsubstituted aryl group; $R^{206}$ represents a substituted or unsubstituted alkyl group or aryl group; and A represents a substituted or unsubstituted alkylene group, alkenylene group, or arylene group.

The specific examples of the compounds represented by formulae (PAG5) and (PAG6) are shown below but the present invention is not limited thereto.

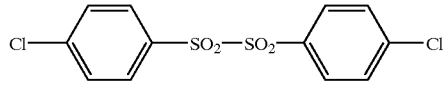
(PAG5-1)

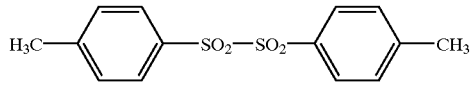
(PAG5-2)

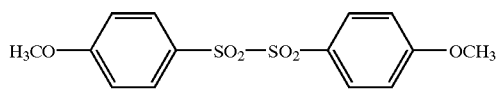
(PAG5-3)

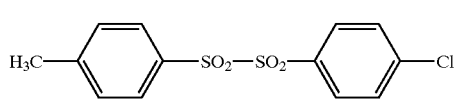
(PAG5-4)

(PAG5-5)

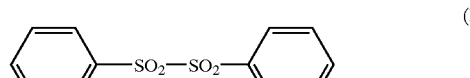
(PAG5-6)

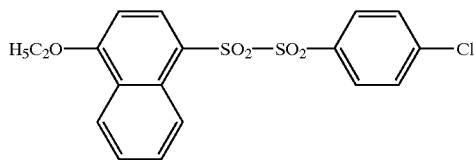
(PAG5-7)

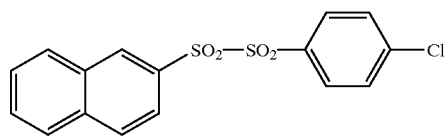
(PAG5-8)

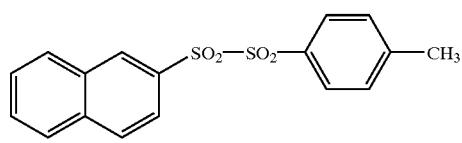
(PAG5-9)

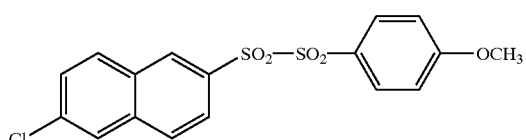
(PAG5-10)

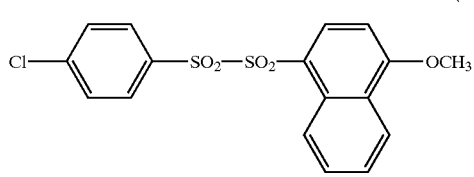
(PAG5-11)

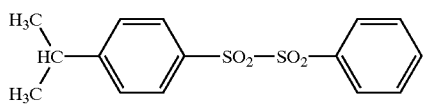
(PAG5-13)

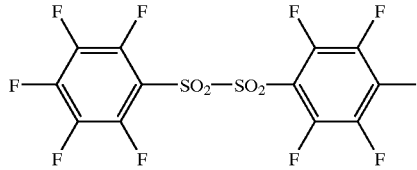
(PAG5-14)

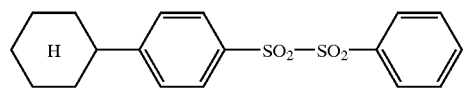
(PAG5-15)

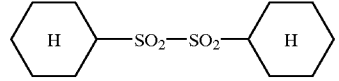
(PAG6-1)

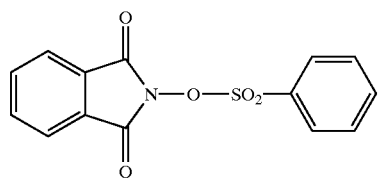

(PAG6-2)
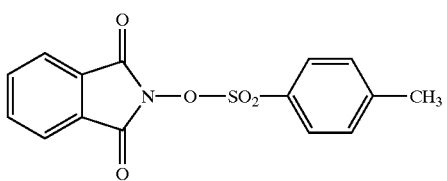
(PAG6-3)
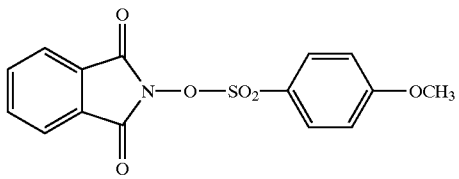
(PAG6-4)
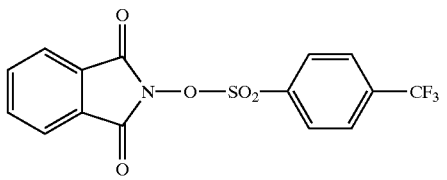
(PAG6-5)
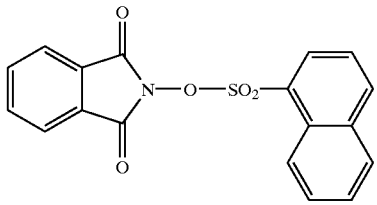
(PAG6-6)
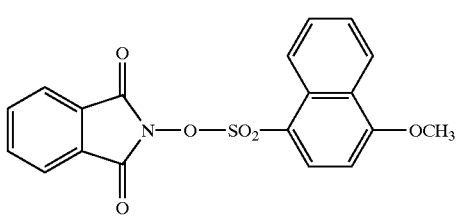
(PAG6-7)
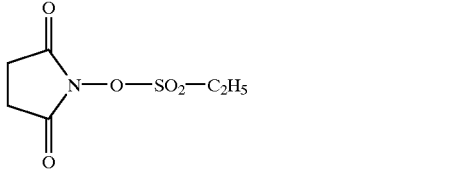
(PAG6-8)
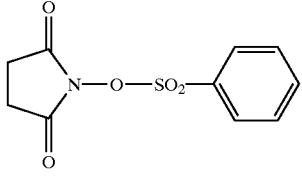
(PAG6-9)
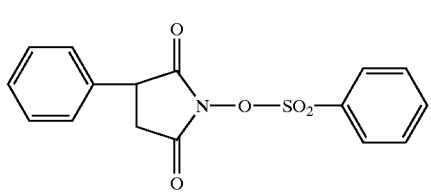
(PAG6-10)
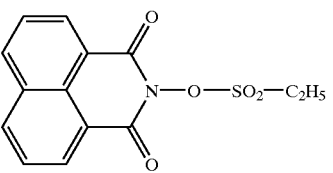
(PAG6-11)
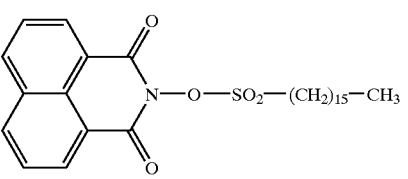
(PAG6-12)
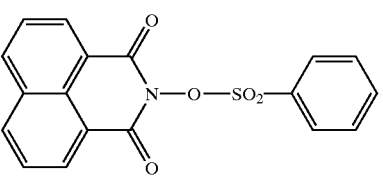
(PAG6-13)
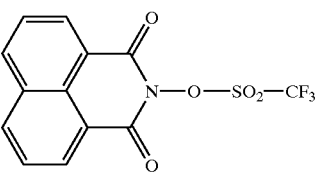
(PAG6-14)
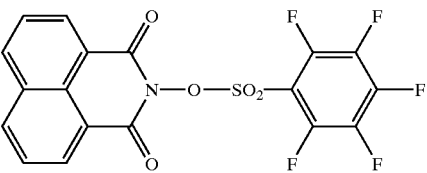
(PAG6-15)
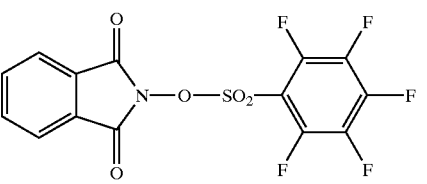
(PAG-6-16)
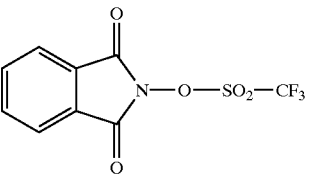
(PAG6-17)
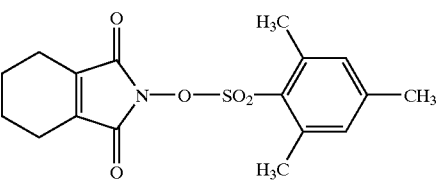

(PAG6-18) through (PAG6-34): chemical structures (4) A Diazodisulfone Derivative Represented by the Following Formula (PAG7)

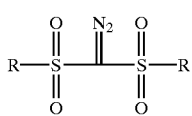
(PAG7)

wherein R represents a straight chain, branched or cyclic alkyl group or a aryl group which may be substituted.

The specific examples of the compounds represented by formula (PAG7) are shown below but the present invention is not limited thereto.

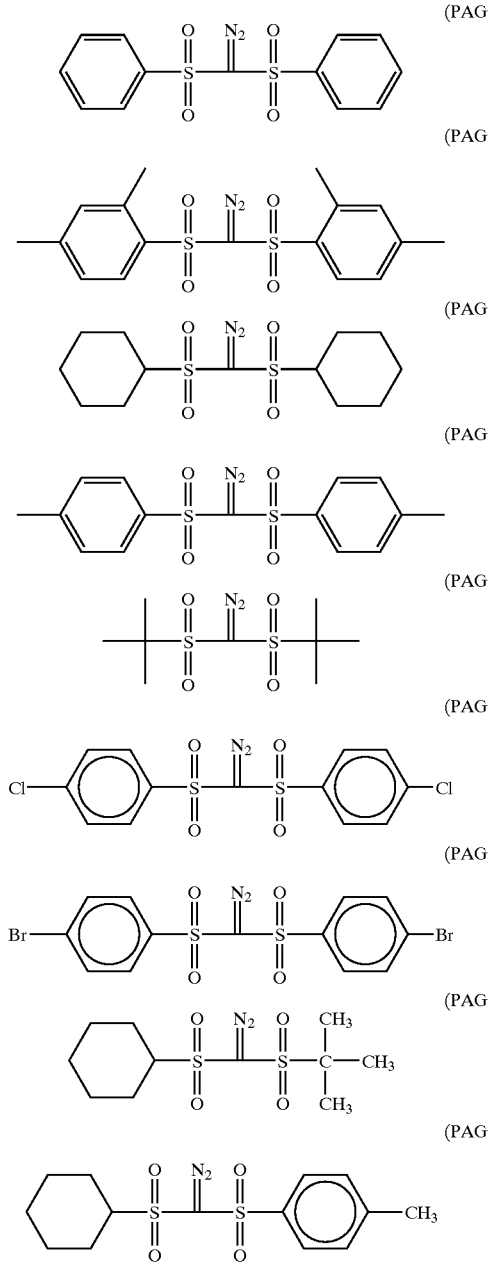

The addition amount of photo-acid generating agent (B) is generally from 0.001 to 20 wt % based on the solid content of the composition, preferably from 0.01 to 15 wt %, and more preferably from 0.1 to 10 wt %. When the addition amount of the photo-acid generating agent is less than 0.001 wt %, the sensitivity decreases, while when the amount is larger than 20 wt %, light absorption of the resist becomes too high, resulting in the deterioration of profile and narrowing of process margin (in particular, baked).

It is particularly preferred to use at least one of the compounds represented by formulae (I'), (II') and (III') as a photo-acid generating agent, by which exposure margin of a resist composition is further improved.

In formulae (I'), (II') and (III'), as the straight chain or branched alkyl group represented by $R_{51}$ to $R_{88}$, an alkyl group having from 1 to 4 carbon atoms, e.g., methyl, ethyl, propyl, n-butyl, sec-butyl and t-butyl can be exemplified. The alkyl group may be substituted. As the cyclic alkyl group represented by $R_{51}$ to $R_{88}$, a cyclic alkyl group having from 3 to 8 carbon atoms, e.g., cyclopropyl, cyclopentyl, and cyclohexyl can be exemplified. The cyclic alkyl group may be substituted As the straight chain or branched alkoxyl group represented by $R_{51}$ to $R_{87}$, an alkoxyl group having from 1 to 4 carbon atoms, e.g., methoxy, ethoxy, hydroxyethoxy, propoxy, n-butoxy, isobutoxy, sec-butoxy and t-butoxy can be exemplified.

As the cyclic alkoxyl group represented by $R_{51}$ to $R_{87}$, e.g., cyclopentyloxy and cyclohexyloxy can be exemplified.

As the halogen atom represented by $R_{51}$ to $R_{87}$, e.g., fluorine, chlorine, bromine and iodine can be exemplified.

As the aryl group represented by $R_{88}$, a aryl group having from 6 to 14 carbon atoms, e.g., phenyl, tolyl, naphthoxyphenyl and naphthyl can be exemplified. The aryl group may be substituted.

As the examples of the substituents, an alkoxyl group having from 1 to 4 carbon atoms, a halogen atom (e.g., fluorine, chlorine, iodine), an aryl group having from 6 to 10 carbon atoms, an alkenyl group having from 2 to 6 carbon atoms, a cyano group, a hydroxyl group, a carboxyl group, an alkoxycarbonyl group and a nitro group can be exemplified.

At least two of $R_{51}$ to $R_{65}$, At least two of $R_{66}$ to $R_{77}$, and At least two of $R_{78}$ to $R_{87}$ may be bonded to form a ring containing one or two or more selected from a single bond, carbon, oxygen, sulfur and nitrogen, e.g., a furan ring, a dihydrofuran ring, a pyran ring, a trihydropyran ring, a thiophene ring and a pyrrole ring.

In formulae (I'), (II') and (III'), X$^-$ denotes an anion represented by $R^F S_3^-$. $R^F$ represents a straight chain, branched or cyclic alkyl group which is substituted with a fluorine atom and has 2 or more carbon atoms, preferably from 2 to 10, more preferably from 2 to 8, and still more preferably from 2 to 5.

$R^F$ is preferably a fluorine-substituted straight chain alkyl group represented by $CF_3 (CF_2)_y$, wherein y represents an integer of from 1 to 15, more preferably an integer of from 1 to 9, and still more preferably from 1 to 5. Due to using these fluorine-substituted straight chain alkyl groups [$CF_3 (CF_2)_y$], excellent balance of sensitivity and resolution can be obtained and the fluctuation of performances from exposure until post-heating reduces.

$R^F$ specifically represents $CF_3CF_2$—, $CF_3(CF_2)_2$—, $CF_3(CF_2)_3$—, $CF_3(CF_2)_4$—, $CF_3(CF_2)_5$—, $CF_3(CF_2)_7$—, $CF_3(CF_2)_9$—, $CF_3(CF_2)_{11}$—, $CF_3(CF_2)_{13}$— or $CF_3(CF_2)_{15}$—, preferably $CF_3CF_2$—, $CF_3(CF_2)_2$—, $CF_3(CF_2)_3$—, $CF_3(CF_2)_4$—, $CF_3(CF_2)_5$—, $CF_3(CF_2)_7$— or $CF_3(CF_2)_9$—, more preferably $CF_3CF_2$—, $CF_3(CF_2)_2$—, $CF_3(CF_2)_3$—, $CF_3(CF_2)_4$— or $CF_3(CF_2)_5$—, and particularly preferably $CF_3(CF_2)_3$—.

A particularly preferred photo-acid generating agent is a compound represented by formula (I') in which X⁻ represents $CF_3(CF_2)_3SO_3^-$.

By using a compound represented by formula (I'), (II') or (III') which is constituted with a sulfonic acid anion having an alkyl group whose anion moiety is substituted with a fluorine atom as a photo-acid generating agent in combination with resin component (A) having a specific structure, the positive photoresist composition according to the present invention is given sufficient sensitivity and resolution to exposure with far ultraviolet rays, in particular, an ArF eximer laser ray (wavelength of 193 nm) and, at the same time, exposure margin is improved.

As the specific examples of the photo-acid generating agents represented by formulae (I'), (II') and (III'), the following compounds (I-1) to (I-32), (II-1) to (II-11) and (III-1) to (III-22) can be exemplified.

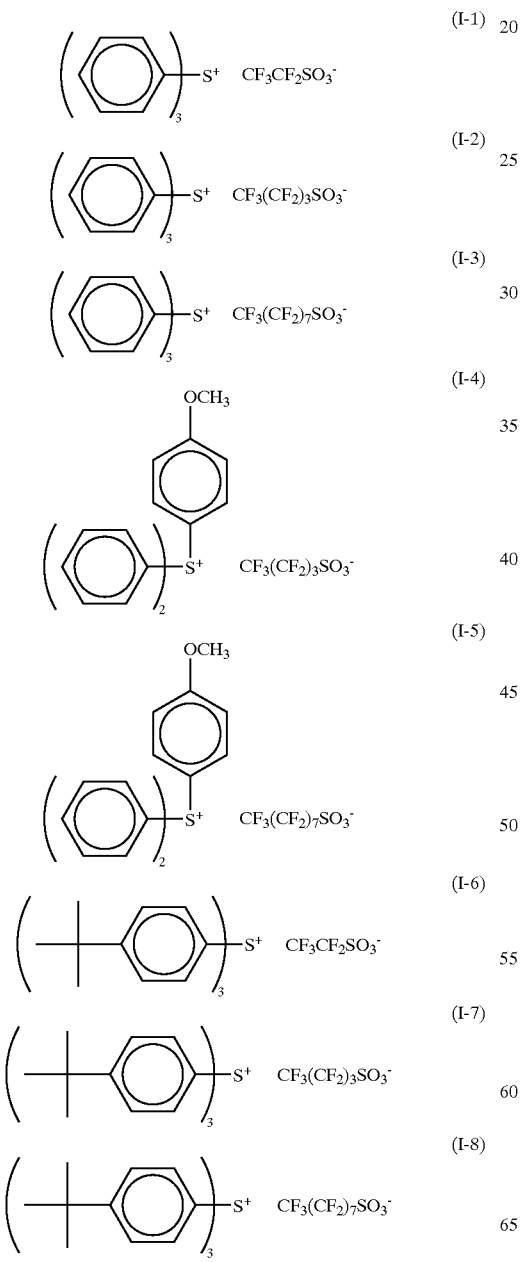
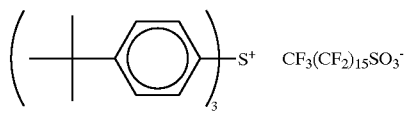
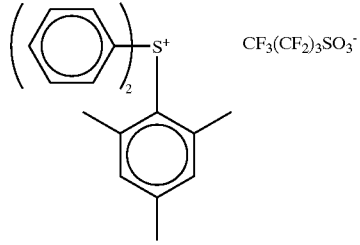
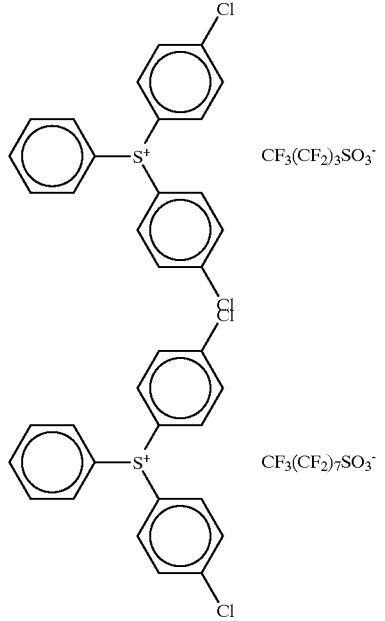
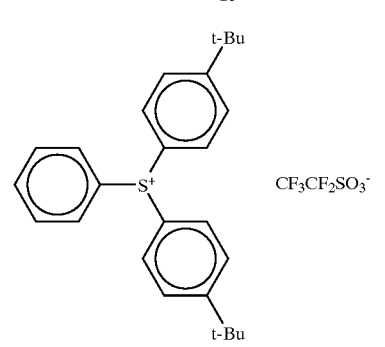
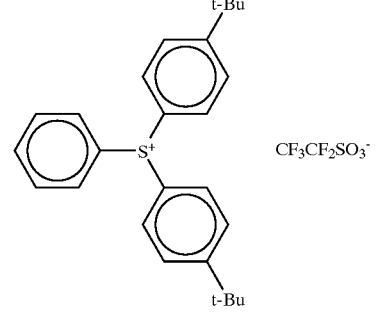
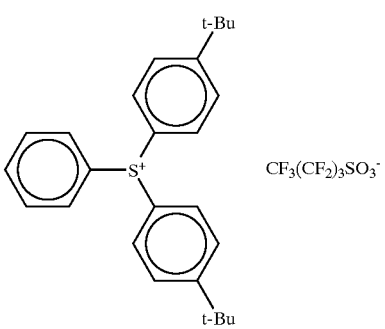

(I-15) 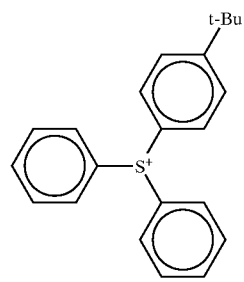 $CF_3(CF_2)_3SO_3^-$
(I-16) 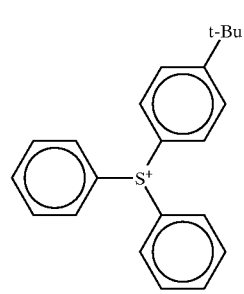 $CF_3(CF_2)_5SO_3^-$
(I-17) 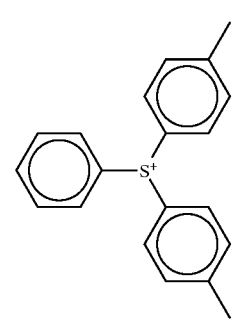 $CF_3(CF_2)_3SO_3^-$
(I-18) 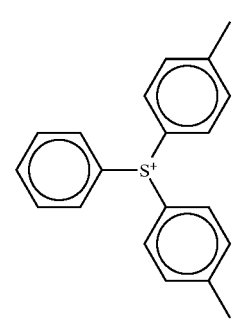 $CF_3(CF_2)_7SO_3^-$
(I-19) 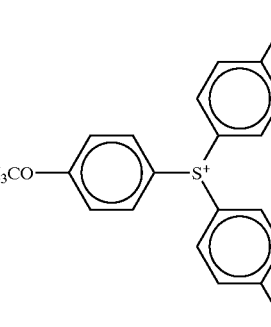 $CF_3CF_2SO_3^-$
(I-20) 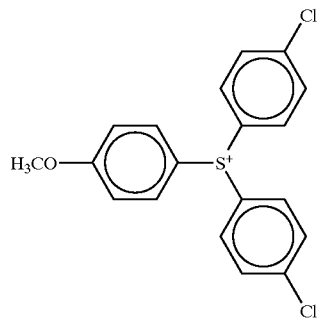 $CF_3(CF_2)_3SO_3^-$
(I-21) 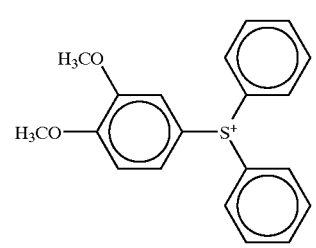 $CF_3CF_2SO_3^-$
(I-22) 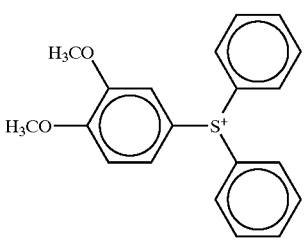 $CF_3(CF_2)_3SO_3^-$
(I-23) 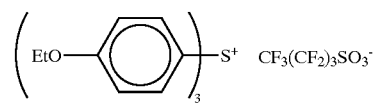 $CF_3(CF_2)_3SO_3^-$
(I-24) 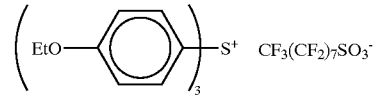 $CF_3(CF_2)_7SO_3^-$
(I-25) 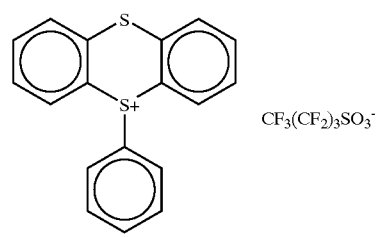 $CF_3(CF_2)_3SO_3^-$
(I-26) 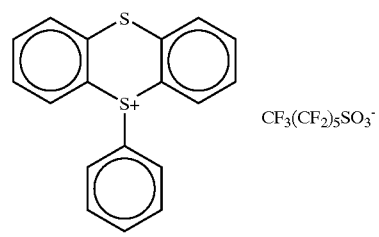 $CF_3(CF_2)_5SO_3^-$ (I-27)
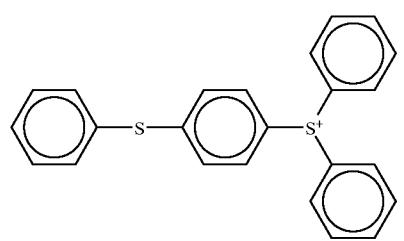
(II-1)
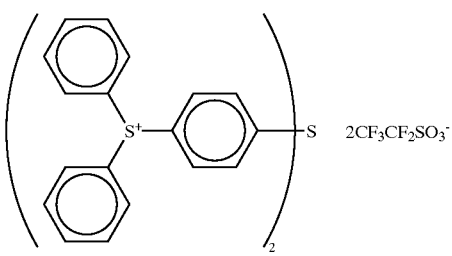
(I-28)
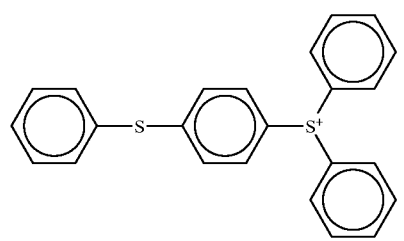
(II-2)
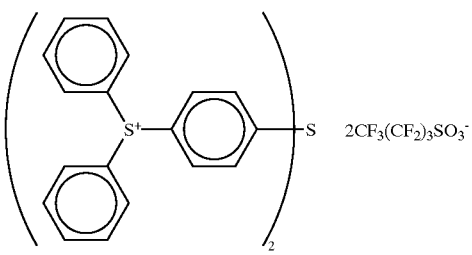
(I-29)
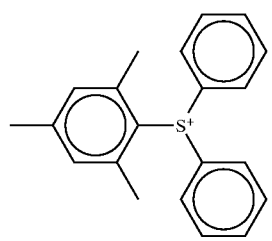
(II-3)
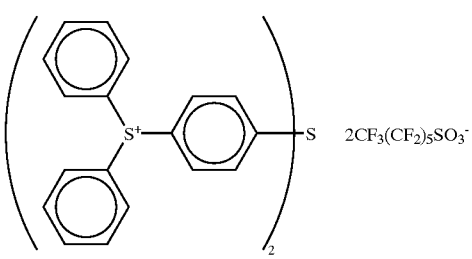
(I-30)
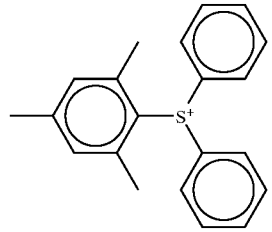
(II-4)
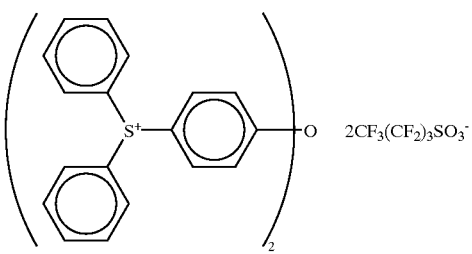
(I-31)
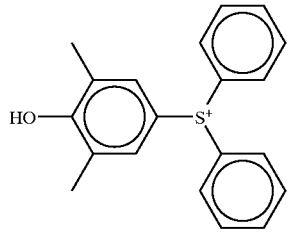
(II-5)
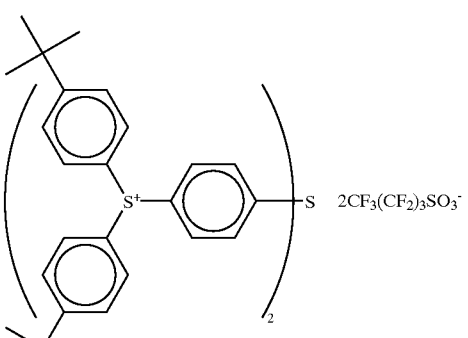
(I-32)
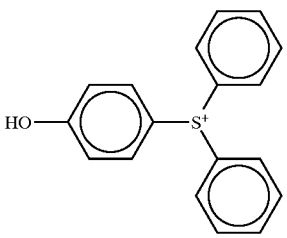

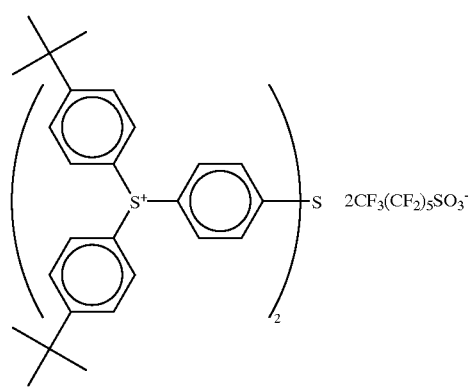 (II-6)
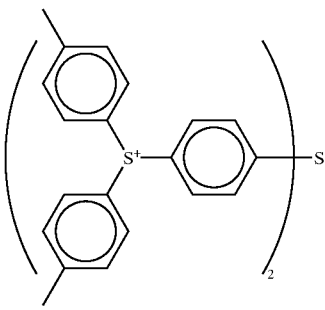 (II-10)
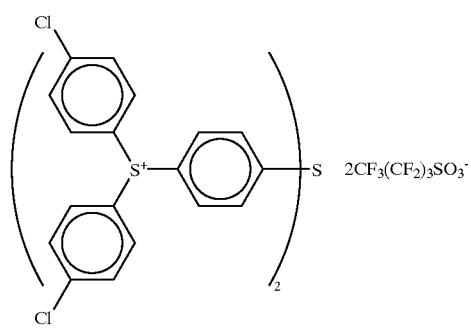 (II-7)
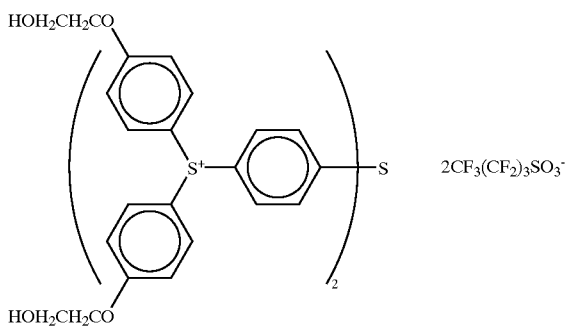 (II-11)
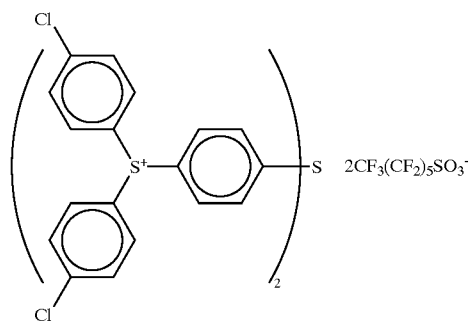 (II-8)
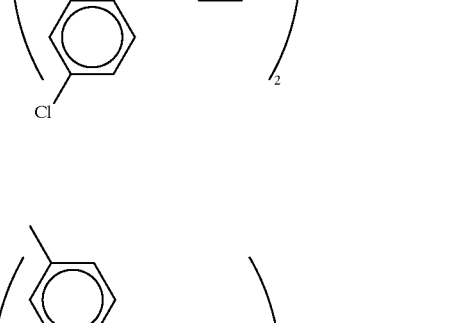 (II-9)
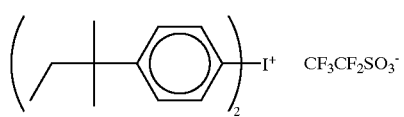 (III-1)
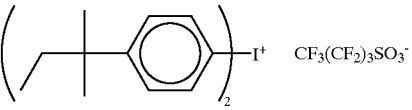 (III-2)
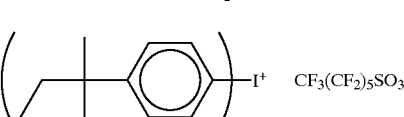 (III-3)
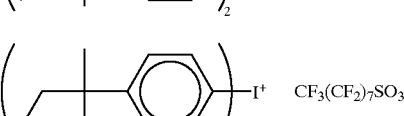 (III-4)
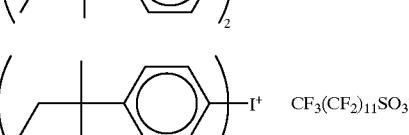 (III-5)
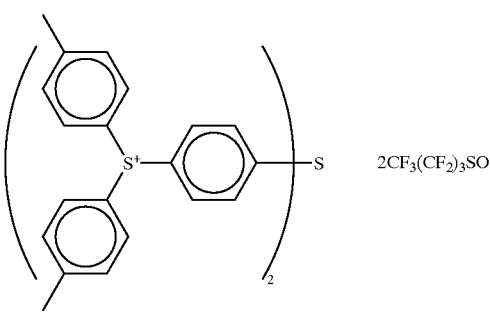 (III-6)
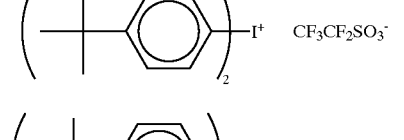 (III-7)

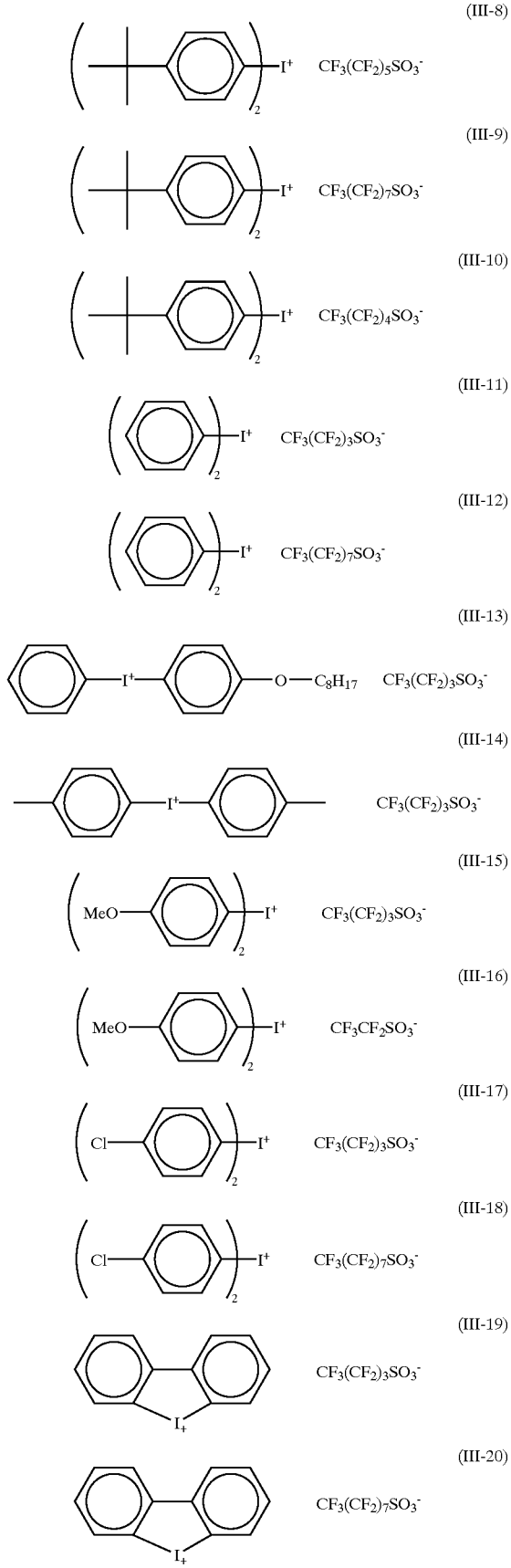

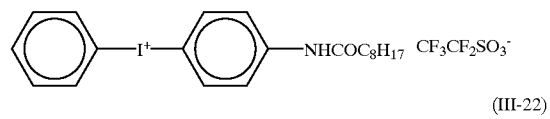

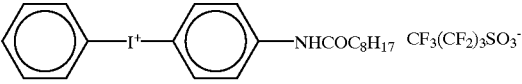

The addition amount of the photo-acid generating agent represented by formula (I'), (II') or (III') is generally from 0.001 to 20 wt % based on the solid content of the composition, preferably from 0.01 to 15 wt %, and more preferably from 0.1 to 10 wt %. When the addition amount of the photo-acid generating agent is less than 0.001 wt %, the sensitivity decreases, while when the amount is larger than 20 wt %, light absorption of the resist becomes too high, resulting in the deterioration of profile and narrowing of process margin (in particular, baked).

When the photo-acid generating agents represented by formula (I'), (II') or (III') are used, photo-acid generating agents other than those represented by formula (I'), (II') or (III') may be used in combination. The addition amount of other photo-acid generating agents used in combination is 1,000 weight parts or less per 100 weight parts of the photo-acid generating agents represented by formula (I'), (II') or (III'), preferably 700 weight parts or less, and more preferably 500 weight parts or less.

[3] (D) Organic Basic Compound

Preferred organic basic compounds (D) which can be used in the present invention are compounds having stronger basicity than a phenol. Nitrogen-containing basic compounds are preferably used above all as the organic basic compound. Sensitivity fluctuation due to the lapse of time can be improved by the addition of organic basic compound (D). A compound having the following structure can be exemplified as such an organic basic compound:

wherein $R^{250}$, $R^{251}$ and $R^{252}$ each represents a hydrogen atom, an alkyl group having from 1 to 6 carbon atoms, an aminoalkyl group having from 1 to 6 carbon atoms, a hydroxyalkyl group having from 1 to 6 carbon atoms, or a substituted or unsubstituted aryl group having from 6 to 20 carbon atoms, and $R^{251}$ and $R^{252}$ may be bonded to form a ring.

-continued

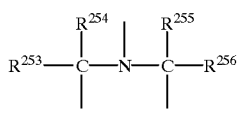

(E)

wherein $R^{253}$, $R^{254}$, $R^{255}$ and $R^{256}$ each represents an alkyl group having from 1 to 6 carbon atoms.

More preferred organic basic compounds are nitrogen-containing organic basic compounds having two or more nitrogen atoms different in chemical environments in one molecule, and particularly preferred compounds are compounds containing both a substituted or unsubstituted amino group and a ring structure containing a nitrogen atom, or compounds having an alkylamino group. The preferred specific examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. The examples of the preferred substituents include an amino group, an aminoalkyl group, an alkylamino group, an aminoaryl group, an arylamino group, an alkyl group, an alkoxyl group, an acyl group, an acyloxy group, an aryl group, an aryloxy group, a nitro group, a hydroxyl group, and a cyano group.

The preferred specific examples of nitrogen-containing basic compounds guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazabicyclo-[4.3.0]nona-5-ene, 1,8-diazabicyclo[5.4.0]undeca-7-ene, 1,4-diazabicyclo[2.2.2]octane, 2,4,5-triphenylimidazole, N-methylmorpholine, N-ethylmorpholine, N-hydroxyethylmorpholine, N-benzylmorpholine, and tertiary morpholine derivatives, e.g., cyclohexylmorpholinoethylthiourea (CHMETU), and hindered amines as disclosed in JP-A-11-52575 (e.g., those disclosed in paragraph [0005] of the same patent), but the present invention is not limited to these compounds.

The particularly preferred examples include 1,5-diazabicyclo[4.3.0]nona-5-ene, 1,8-diazabicyclo[5.4.0]undeca-7-ene, 1,4-diazabicyclo[2.2.2]octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2,6,6-pentamethyl-4-piperidyl)sebacate.

The particularly preferred compounds above all are 1,5-diazabicyclo[4.3.0]nona-5-ene, 1,8-diazabicyclo[5.4.0]undeca-7-ene, 1,4-diazabicyclo[2.2.2]octane, 4-dimethylaminopyridine, hexamethylenetetramine, CHMETU, and bis(1,2,2,6,6-pentamethyl-4-piperidyl)sebacate.

These organic basic compounds are used alone or two or more of them are used in combination. The amount of the organic basic compounds to be used is generally from 0.001 to 10 wt % of the solid content of the entire composition of the photosensitive resin composition, preferably from 0.01 to 5 wt %. If the amount is less than 0.001 wt %, the effect of addition of these organic basic compounds cannot be obtained.

On the other hand, when the addition amount exceeds 10 wt %, sensitivity lowers and the developing property of an unexposed part is liable to deteriorate.

[4] (E) Fluorine- and/or Silicon-Containing Surfactant

The positive photoresist composition of the present invention preferably contains a surfactant containing at least one of a fluorine atom and a silicon atom (a fluorine- and/or silicon-containing surfactant).

It is preferred for the positive photoresist composition according to the present invention to contain any one, or two or more, of a fluorine-based surfactant, a silicon-based surfactant, and a surfactant containing both a fluorine atom and a silicon atom.

By containing the above-described acid-decomposable resin and surfactant, the pitch dependency of the positive photoresist composition according to the present invention is improved.

These surfactants are disclosed, e.g., in JP-A-62-36663, JP-A-61-226746, JP-A-61-227645, JP-A-62-170950, JP-A-63-34540, JP-A-7-320165, JP-A-8-62834, JP-A-9-54432, JP-A-9-5988, U.S. Pat. Nos. 5,405,720, 5,360,692, 5,529,881, 5,296,330, 5,436,098, 5,576,143, 5,294,511, and 5,824,451. The following described commercially available surfactants can be used as they are.

As the commercially available surfactants which can be used in the present invention, fluorine-based surfactants and silicon-based surfactants, e.g., fluorine-based surfactants EFTOP EF301 and EF303 (manufactured by Shin-Akita Chemical Co., Ltd.), fluorine-based surfactants Florad FC430 and FC431 (manufactured by Sumitomo 3M Co., Limited), fluorine-based surfactants and MEGFAC F171, F173, F176, and F189, and fluorine and silicon-based surfactant MEGAFAC R08 (manufactured by Dainippon Ink & Chemical, Co., Ltd.), fluorine-based surfactants SURFLON S-382, SC101, SC102, SC103, SC104, SC105 and SC106 (manufactured by Asahi Glass Co., Ltd.) and silicon-based surfactant TROYSOL S-366 (manufactured by Troy Chemical Inc.) can be exemplified. Polysiloxane polymer KP-341 (manufactured by Shin-Etsu Chemical Co., Ltd.) can also be used as the silicon-based surfactant.

The compounding proportion of surfactants (E) is generally from 0.001 to 2 wt % based on the solid content of the composition, preferably from 0.01 to 1 wt %. Surfactants (E) may be used alone or two or more may be used in combination.

The specific examples of other surfactants which can be used in the present invention include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

The proportion of these other surfactant is 2 weight parts or less per 100 weight parts of the solid content in the composition, preferably 1 weight part or less.

The positive photoresist composition according to the present invention is coated using at least one solvent selected from propylene glycol monoalkyl ether acetates, e.g., propylene glycol monomethyl ether acetate and propylene glycol monoethyl. ether acetate, lactic acid alkyl esters, e.g., methyl lactate and ethyl lactate, propylene glycol monoalkyl ethers, e.g., propylene glycol monomethyl ether and propylene glycol monoethyl ether, ethylene glycol monoalkyl ethers, e.g., ethylene glycol monomethyl ether and ethylene glycol monoethyl ether, ethylene glycol monoalkyl ether acetate, e.g., ethylene glycol monomethyl ether acetate and ethylene glycol monoethyl ether acetate, alkoxypropionic acid alkyls, e.g., 2-heptanone, γ-butyrolactone, methoxypropionic acid methyl and ethoxypropionic acid ethyl, pyruvic acid alkyl esters, e.g., methyl pyruvate and ethyl pyruvate, N-methylpyrrolidone, N,N-dimethylacetatmide, dimethyl sulfoxide, etc.

It is preferred in the present invention that the solid contents of the resist composition containing the above-described each component be dissolved in the above-described solvent in solid concentration of from 3 to 25 wt %, more preferably from 5 to 22 wt %, and still more preferably from 7 to 20 wt %.

The positive photoresist composition of the present invention can further contain, if necessary, an acid-decomposable dissolution-inhibiting compound, a dye, a plasticizer, a photo-sensitizer and a compound which accelerates the solubility in a developing solution.

The positive photoresist composition according to the present invention is coated on a substrate to form a film. The thickness of the coated film is preferably from 0.2 to 1.2 μm. In the present invention, a commercially available inorganic or organic anti-reflecting coating can be used, if necessary.

As the anti-reflecting coating, inorganic coatings, e.g., titanium, titanium dioxide, titanium nitride, chromium oxide, carbon, α-silicon, SiON, tungsten Si and polysilicon, and organic coatings comprised of a light-absorbing agent and a polymer material can be used. The former requires for film-forming an apparatus, such as a vacuum deposition apparatus, a CVD apparatus or a sputtering apparatus. As the organic anti-reflecting coatings, e.g., a anti-reflecting coating comprising the condensation product of a diphenylamine derivative and a formaldehyde-modified melamine resin, an alkali-soluble resin and a light-absorbing agent disclosed in JP-B-7-69611 (the term "JP-B" as used herein means an "examined Japanese patent publication"), a reaction product comprising a maleic anhydride copolymer and a diamine type light-absorbing agent disclosed in U.S. Pat. No. 5,294,680, a anti-reflecting coating containing a resin binder and a methylolmelamine-based crosslinking agent disclosed in JP-A-6-118631, an acrylate resin-type anti-reflecting coating having a carboxylic acid group, an epoxy group and a light-absorbing group in the same molecule disclosed in JP-A-6-118656, a anti-reflecting coating comprising a methylolmelamine and a benzophenone-based light-absorbing agent disclosed in JP-A-8-87115, and a anti-reflecting coating comprising a polyvinyl alcohol resin and a low molecular weight light-absorbing agent disclosed in JP-A-8-179509 can be exemplified.

Further, DUV-30 series and DUV-40 series manufactured by Brewer Science Co. and AC-2 and AC-3 manufactured by Chypre Co. can be used as the organic anti-reflecting coating.

After coating the above resist coating solution on such a substrate as used in the production of a precise integrated circuit element (e.g., silicon/silicon dioxide coating) (or the above substrate is provided with a anti-reflecting coating, if necessary) by an appropriate coating method with a spinner or a coater, the coated film is subjected to exposure through a prescribed mask, baking and development, thereby a good resist pattern can be obtained. The lights for exposure are preferably lights having wavelengths of from 150 nm to 250 nm. Specifically, a KrF eximer laser (248 nm), an ArF eximer laser (193 nm), an $F_2$ eximer laser (157 nm), an X-ray, an electron beam, etc., can be exemplified.

As the developing solution, an alkaline aqueous solution, such as inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine, methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

Further, an appropriate amount of alcohols and surfactants can be added to the above alkaline aqueous solution.

The present invention is explained in more detail with reference to the following examples, but the present invention should not be construed as being limited thereto.

(1) Synthesis of Resin (1)

Norbornene, maleic anhydride, and acrylate monomer corresponding to the structural unit represented by formula (IIa), which are constituting the above-exemplified resin (1) were charged in a reaction vessel in a molar ratio of 35/35/30 and dissolved in methyl ethyl ketone, thereby a solution containing solid content of 60% was prepared. The obtained solution was heated at 60° C. in a nitrogen gas. When the reaction temperature was stabilized, 1.5 mol % of a radical initiator V-601 (manufactured by Wako Pure Chemical Co., Ltd.) was added to the reaction solution to initiate a reaction. After heating for 10 hours, the reaction mixture was poured into hexane of five times the amount of the reaction mixture, to thereby precipitate a white powder. The precipitated powder was dissolved again in methyl ethyl ketone, poured into hexane of five times the amount of the reaction mixture, and the precipitated white powder was recovered by filtration. This procedure was repeated again, followed by drying, and objective resin (1) was obtained.

As a result of molecular weight analysis by GPC, the weight average molecular weight of resin (1) was 13,400 in terms of polystyrene. The composition of resin (1) was found from NMR spectrum to be comprised of 29/44/27 in molar ratio of norbornene/maleic anhydride/acrylate monomer corresponding to the structural unit of formula (IIa).

Resins (2) to (14) were synthesized in the same manner as in the synthesis of resin (1). The composition ratio and the weight average molecular weight (Mw) of each of the resins are shown in Table 1 below.

TABLE 1

| Resin | Norbornene | Monomer Represented by Formula (III) | Monomer Represented by Formula (IIa) or (IIb) | Fourth Component | Molecular Weight (Mw) |
|---|---|---|---|---|---|
| (2) | 30 | 45 | 25 | — | 12,300 |
| (3) | 32 | 41 | 27 | — | 12,800 |
| (4) | 28 | 38 | 22 | 12 | 12,600 |
| (5) | 20 | 31 | 33 | 16 | 13,400 |
| (6) | 24 | 33 | 27 | 16 | 13,300 |
| (7) | 25 | 34 | 26 | 15 | 11,500 |
| (8) | 23 | 32 | 31 | 14 | 12,100 |
| (9) | 31 | 41 | 28 | — | 13,600 |
| (10) | 30 | 42 | 28 | — | 11,900 |
| (11) | 26 | 39 | 25 | 10 | 12,200 |
| (12) | 21 | 35 | 32 | 12 | 13,200 |
| (13) | 22 | 39 | 23 | 16 | 11,600 |
| (14) | 23 | 39 | 23 | 15 | 11,000 |

(2) Synthesis of Resin (15)

Norbornene, maleic anhydride, and acrylate monomer corresponding to the structural unit represented by formula (IIc) which are constituting the above-exemplified resin (15) were charged in a reaction vessel in a molar ratio of 35/35/30 and dissolved in tetrahydrofuran, thereby a solution containing solid content of 60% was prepared. The obtained solution was heated at 60° C. in a nitrogen gas. When the reaction temperature was stabilized, 1 mol % of a radical initiator V-601 (manufactured by Wako Pure Chemical Co., Ltd.) was added to the reaction solution to initiate a reaction. After heating for 10 hours, the reaction mixture was poured into hexane of five times the amount of the reaction mixture, to thereby precipitate a white powder. The precipitated powder was dissolved again in methyl ethyl ketone, poured into hexane of five times the amount of the reaction mixture, and the precipitated white powder was recovered by filtration. This procedure was repeated again, followed by drying, and objective resin (15) was obtained.

As a result of molecular weight analysis by GPC, the weight average molecular weight of resin (15) was 11,400 in terms of polystyrene. The composition of resin (15) was found from NMR spectrum to be comprised of 29/45/26 in molar ratio of norbornene/maleic anhydride/acrylate monomer corresponding to the structural unit of formula (IIc).

Resins (16) to (21) were synthesized in the same manner as in the synthesis of resin (15). The composition ratio and the weight average molecular weight (Mw) of each of the resins are shown in Table 2 below.

TABLE 2

| Resin | Norbornene | Monomer Represented by Formula (III) | Monomer Represented by Formula (IIc) | Fourth Component | Molecular Weight (Mw) |
|---|---|---|---|---|---|
| (16) | 28 | 48 | 24 | — | 11,300 |
| (17) | 31 | 39 | 30 | — | 12,400 |
| (18) | 30 | 39 | 23 | 8 | 12,900 |
| (19) | 21 | 32 | 29 | 18 | 13,900 |
| (20) | 27 | 35 | 26 | 12 | 13,400 |
| (21) | 27 | 36 | 28 | 9 | 13,700 |

EXAMPLES 1 TO 18 AND COMPARATIVE EXAMPLE 1

Preparation and Evaluation of Positive Photoresist Composition

Two grams of each resin synthesized above (shown in Table 3 below), a photo-acid generating agent shown in Table 3 (in the amount shown in Table 3), 5 mg of an organic basic compound, and 5 mg of a surfactant were blended, dissolved in a solvent shown in Table 3 in the ratio of 10 wt % of solid content, filtered through a micro-filter having a pore diameter of 0.1 μm, thereby each of the positive photoresist compositions of Examples 1 to 18 was prepared.

The positive photoresist composition of Comparative Example 1 was prepared in the same manner as in Example 1, except that a resin, a photo-acid generating agent (PAG-R: 4-methylphenyldiphenylsulfonium trifluoromethanesulfonate) and a solvent respectively shown in Table 3 were used.

The solvents shown in symbols in Table 3 below stand for the following:

S1: Propylene glycol monomethyl ether acetate
S2: Propylene glycol monomethyl ether propionate
S4: Butyl acetate
S5: 2-Heptanone
S8: γ-Butyrolactone
S9: Ethylene carbonate

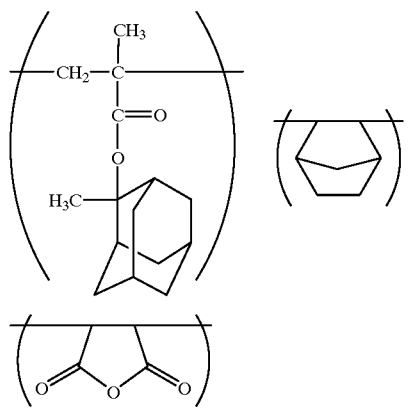

TABLE 3

| Example No. | (A) Resin Component | (B) Photo-acid generating agent | (C) Solvent | (E) Surfactant | (D) Organic Basic Compound |
|---|---|---|---|---|---|
| Example 1 | Resin (1) | PAG4–5 (42 mg) | S1 | 1 | 1 |
| Example 2 | Resin (2) | I-2 (39 mg) | S1 | 3 | 2 |
| Example 3 | Resin (3) | PAG4–38 (41 mg) | S2 | 4 | 3 |
| Example 4 | Resin (4) | I-4/PAG6–19 (35/10 mg) | S1/S4 (80/20) | 1 | 4 |
| Example 5 | Resin (5) | I-6 (35 mg) | S1/S5 (70/30) | 2 | 3 |
| Example 6 | Resin (6) | PAG4–7 (40 mg) | S1/S8 (90/10) | 3 | 1 |
| Example 7 | Resin (7) | I-7/PAG6–27 (30/20 mg) | S1/S4/S9 (80/10/10) | 5 | 2 |
| Example 8 | Resin (8) | II-2 (45 mg) | S1/S9 (80/20) | 5 | 2 |
| Example 9 | Resin (9) | PAG4–47 (32 mg) | S1 | 4 | 3 |
| Example 10 | Resin (10) | III-2 (36 mg) | S1 | 5 | 2 |
| Example 11 | Resin (11) | I-15/PAG6–23 (38/20 mg) | S1/S4 (70/30) | 2 | 1 |
| Example 12 | Resin (12) | I-27 (38 mg) | S1 | 1 | 2 |
| Example 13 | Resin (13) | I-9/PAG7–3 (40/10 mg) | S1/S8 (90/10) | 2 | 4 |
| Example 14 | Resin (14) | I-16/PAG7–5 (35/20 mg) | S1/S9 (85/15) | 2 | 2 |
| Example 15 | Resin (4) | PAG4–51 (40 mg) | S1 | — | 4 |
| Example 16 | Resin (8) | I-18 (40 mg) | S1 | 3 | 1 |
| Example 17 | Resin (5) | PAG6–15 (50 mg) | S1 | 2 | 2 |
| Example 18 | Resin (11) | PAG4–5 (40 mg) | S1 | — | — |
| Comparative Example 1 | Resin (R) | PAG-R (40 mg) | S1 | — | 4 |

The surfactants shown in symbols stand for the following:

1: Fluorine-based surfactant MEGAFAC F176 (fluorine-containing surfactant (manufactured by Dainippon Chemicals & Ink Co., Ltd.)
2: Fluorine and silicon-based surfactant MEGAFAC R08 (fluorine and silicon-containing surfactant (manufactured by Dainippon Chemicals & Ink Co., Ltd.)
3: Polysiloxane polymer KP-341 (manufactured by Shin-Etsu Chemical Co., Ltd.)
4: Polyoxyethylenenonylphenyl ether
5: Silicon-based surfactant TROYSOL S-366 (manufactured by Troy Chemical Inc.)

The organic basic compounds shown in symbols stand for the following:

1: DBU (1,8-Diazabicyclo[5.4.0]-7-undecene)
2: 4-DMAP (4-Dimethylaminopyridine)
3: TPI (2,4,5-Triphenylimidazole)
4: 2,6-Diisopropylaniline Resin (R): A resin having the following structure synthesized according to Synthesis Example 8 in JP-A-11-305444.

Test for Evaluation

Each resist solution prepared above was coated on an SiON substrate treated with HMDS (hexamethyldisilazane), baked at 130° C. for 90 seconds, thereby a wafer having a thickness of 0.20 μm was obtained.

The thus-obtained wafer was subjected to exposure using an ArF eximer laser stepper (ArF exposure apparatus 9300, manufactured by ISI Co., Ltd.) having a resolving mask loaded, with varying the exposure amount and the focus, heated at 130° C. for 90 seconds in a clean room, development processed in a tetramethylammonium hydroxide developing solution (2.38 wt %) for 60 seconds, rinsed with distilled water and dried, thereby a pattern was obtained.

The resist pattern of the thus-obtained silicon wafer was observed with a scanning electron microscope, and the resist was evaluated as described below.

The results obtained are shown in Table 4 below.

Number of Particles and Increased Number of Particles after Storage

The number of the particles in the coating solution of the positive photoresist composition as prepared above was counted using a particle counter (manufactured by Lyon Co., Ltd.) just after preparation (initial value of particles) and after the solution was allowed to stand at 40° C. for one week (particle number after the lapse of time). The initial value of particles and the increased number of particles obtained by subtracting (the initial value of particles) from (the particle number after the lapse of time) were evaluated. The particles having a particle size of 0.2 μm or more in 1 ml of the resist solution were counted.

Adhering Property

The above-obtained resist pattern profile was observed with a scanning electron microscope (SEM) and evaluated by the remaining finest line width. That is, the finer the remaining line width, the higher is the adhering property.

Exposure Margin

The fluctuation coefficient (%) of the line width in the repeating pattern of 0.14 μm obtained in case that the exposure amount to reproduce the line width in the repeating pattern of 0.14 μm was fluctuated by ±5%, was made the barometer of exposure margin. The smaller the value, the more preferred is the exposure margin.

Fluctuation of Sensitivity Before and After Storage

The above-prepared positive photoresist composition solution was coated on a silicon wafer and dried at 130° C. for 90 seconds, thereby a film having a film thickness of 0.20 μm was obtained. The thus-obtained wafer was subjected to exposure using an ArF eximer laser stepper (ArF exposure apparatus 9300, manufactured by ISI Co., Ltd.) having a resolving mask loaded, with varying the exposure amount, heated at 130° C. for 90 seconds in a clean room, development processed in a tetramethylammonium hydroxide developing solution (2.38 wt %) for 60 seconds, rinsed with distilled water and dried, thereby a pattern was obtained.

The sensitivity just after preparation of the coating solution of the positive photoresist composition (the minimum exposure amount to reproduce line and space pattern of 0.15 μm was taken as sensitivity) and the sensitivity after the composition solution was allowed to stand at 40° C. for one week were evaluated (in the similar manner to the above). Sensitivity fluctuation coefficient was evaluated by the following equation.

Sensitivity Fluctuation Coefficient (%)=|(sensitivity before storage)−(sensitivity after storage)|/(sensitivity before storage)×100

The results obtained are shown in Table 4 below.

TABLE 4

| Example No. | Initial Value of Particles | Increased Number of Particles | Adhering Property (nm) | Exposure Margin (%) | Sensitivity Fluctuation Coefficient (%) |
| --- | --- | --- | --- | --- | --- |
| Example 1 | 5 | <5 | 100 | 9 | <5 |
| Example 2 | 5 | <5 | 95 | 6 | <5 |
| Example 3 | 5 | <5 | 105 | 10 | <5 |
| Example 4 | <5 | <5 | 80 | 5 | <5 |
| Example 5 | <5 | <5 | 80 | 5 | <5 |
| Example 6 | <5 | <5 | 80 | 7 | <5 |
| Example 7 | <5 | <5 | 80 | 5 | <5 |
| Example 8 | <5 | <5 | 80 | 5 | <5 |
| Example 9 | 15 | 10 | 120 | 10 | <5 |
| Example 10 | 10 | 10 | 115 | 7 | <5 |
| Example 11 | 5 | 5 | 100 | 6 | <5 |
| Example 12 | 5 | 5 | 100 | 6 | <5 |
| Example 13 | 5 | 5 | 105 | 6 | <5 |
| Example 14 | 5 | 5 | 105 | 6 | <5 |
| Example 15 | <5 | 5 | 90 | 9 | <5 |
| Example 16 | <5 | <5 | 80 | 5 | <5 |
| Example 17 | <5 | <5 | 85 | 10 | <5 |
| Example 18 | 5 | 10 | 105 | 10 | 10 |
| Comparative Example 1 | 30 | 150 | 180 | 20 | 20 |

It can be understood from the results shown in Table 4 that the positive photoresist composition according to the present invention is excellent not only in storage stability but in adhering property, exposure margin and the fluctuation of sensitivity after aging.

EXAMPLES 19 TO 36 AND COMPARATIVE EXAMPLE 2

Preparation and Evaluation of Positive Photoresist Composition

Two grams of each resin synthesized above (shown in Table 5 below), a photo-acid generating agent shown in Table 5 (in the amount shown in Table 5), 5 mg of an organic basic compound, and 5 mg of a surfactant were blended, dissolved in a solvent shown in Table 5 in the ratio of 10 wt % of solid content, filtered through a micro-filter having a pore diameter of 0.1 μm, thereby each of the positive photoresist compositions of Examples 19 to 36 was prepared.

The positive photoresist composition of Comparative Example 2 was prepared in the same manner as in Example 19, except that a resin, a photo-acid generating agent (PAG-R: 4-methylphenyldiphenylsulfonium trifluoromethanesulfonate), a solvent and an organic basic compound respectively shown in Table 5 were used.

The solvents shown in symbols in Table 5 below stand for the following:

S1: Propylene glycol monomethyl ether acetate
S2: Propylene glycol monomethyl ether propionate
S4: Butyl acetate
S5: 2-Heptanone
S8: γ-Butyrolactone
S9: Ethylene carbonate The surfactants shown in symbols stand for the following:

1: Megafac F176 (fluorine-containing surfactant (manufactured by Dainippon Chemicals & Ink Co., Ltd.)
2: Megafac R08 (fluorine and silicon-containing surfactant (manufactured by Dainippon Chemicals & Ink Co., Ltd.)
3: Polysiloxane polymer KP-341 (manufactured by Shin-Etsu Chemical Co., Ltd.)
4: Polyoxyethylenenonylphenyl ether
5: Troysol S-366 (manufactured by Troy Chemical Inc.)

The organic basic compounds shown in symbols stand for the following:

1: DBU (1,8-Diazabicyclo[5.4.0]-7-undecene)
2: 4-DMAP (4-Dimethylaminopyridine)
3: TPI (2,4,5-Triphenylimidazole)
4: 2,6-Diisopropylaniline Resin (R): A resin having the following structure synthesized according to Synthesis Example 8 in JP-A-11-305444.

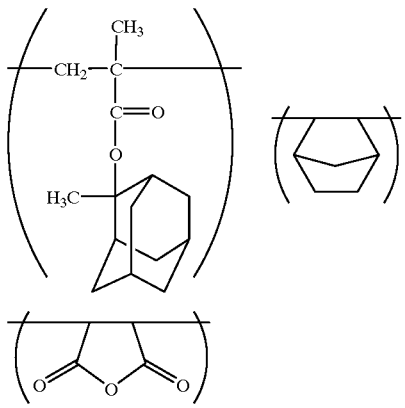

Test for Evaluation

Each resist solution prepared above was coated on an SiON substrate treated with HMDS (hexamethyldisilazane), baked at 130° C. for 90 seconds, thereby a wafer having a thickness of 0.20 μm was obtained.

The thus-obtained wafer was subjected to exposure using an ArF eximer laser stepper (ArF exposure apparatus 9300, manufactured by ISI Co., Ltd.) having a resolving mask loaded, with varying the exposure amount and the focus, heated at 130° C. for 90 seconds in a clean room, development processed in a tetramethylammonium hydroxide developing solution (2.38 wt %) for 60 seconds, rinsed with distilled water and dried, thereby a pattern was obtained.

The resist pattern of the thus-obtained silicon wafer was observed with a scanning electron microscope, and the resist was evaluated as described below.

The results obtained are shown in Table 6 below.

Adhering Property

The above-obtained resist pattern profile was observed with a scanning electron microscope (SEM) and evaluated by the remaining finest line width. That is, the finer the remaining line width, the higher is the adhering property.

Exposure Margin

The fluctuation coefficient (%) of the line width in the repeating pattern of 0.14 μm obtained in case that the exposure amount to reproduce the line width in the repeating pattern of 0.14 μm was fluctuated by ±5%, was made the barometer of exposure margin. The smaller the value, the more preferred is the exposure margin.

Development Defect

Each resist film was coated in a thickness of 0.3 μm on a bare Si substrate having a length of 6 inches, and dried by a vacuum adsorption-type hot plate at 130° C. for 60 sec. The resist film was subjected to exposure with an ArF eximer laser stepper (ArF exposure apparatus 9300, manufactured by ISI Co., Ltd.) through a test mask of 0.35 μm contact hole pattern (hole duty ratio: 1/3), and the resist was heated at 120° C. for 90 sec. after exposure. Subsequently, the resist was subjected to development using a 2.38% TMAH (tetramethylammonium hydroxide) aqueous solution with a paddle, washed with pure water for 30 seconds, and then spin-dried. The development defect of the thus-obtained sample was measured with model KLA-2112 manufactured by KLA Tencor. The primary data value obtained was taken as the development defect number.

TABLE 5

| Example No. | (A) Resin Component | (B) Photo-acid generating agent | (C) Solvent | (E) Surfactant | (D) Organic Basic Compound |
|---|---|---|---|---|---|
| Example 19 | Resin (15) | PAG4–5 (40 mg) | S1 | 1 | 1 |
| Example 20 | Resin (16) | I-2 (39 mg) | S1 | 3 | 2 |
| Example 21 | Resin (17) | PAG4–38 (41 mg) | S1 | 4 | 3 |
| Example 22 | Resin (18) | I-4/PAG6–19 (35/10 mg) | S1/S4 (80/20) | 1 | 4 |
| Example 23 | Resin (19) | I-6 (35 mg) | S1/S5 (10(30) | 2 | 3 |
| Example 24 | Resin (20) | PAG4–7 (40 mg) | S1/S8 (90/10) | 3 | 1 |
| Example 25 | Resin (21) | I-7/PAG6–27 (30/20 mg) | S1/S4/S9 (80/10/10) | 5 | 2 |
| Example 26 | Resin (15) | II-2 (45 mg) | S1/S9 (80/20) | 5 | 2 |
| Example 27 | Resin (16) | PAG4–47 (32 mg) | S2 | 4 | 3 |
| Example 28 | Resin (17) | III-2 (36 mg) | S1 | 5 | 2 |
| Example 29 | Resin (18) | I-15/PAG6–23 (38/20 mg) | S1/S4 (70/30) | 2 | 1 |
| Example 30 | Resin (19) | I-27 (38 mg) | S1 | 1 | 2 |
| Example 31 | Resin (20) | II-9/PAG7–3 (40/10 mg) | S1/S8 (90/10) | 2 | 4 |
| Example 32 | Resin (21) | I-16/PAG7–5 (35/20 mg) | S1/S9 (85/15) | 2 | 2 |
| Example 33 | Resin (18) | PAG4–51 (40 mg) | S1 | — | 4 |
| Example 34 | Resin (21) | I-18 (40 mg) | S1 | 3 | 1 |
| Example 35 | Resin (19) | PAG6–15 (50 mg) | S1 | 2 | 2 |
| Example 36 | Resin (15) | PAG4–5 (40 mg) | S1 | — | — |
| Comparative Example 2 | Resin (R) | PAG-R (40 mg) | S1 | — | 4 |

Fluctuation of Sensitivity Before and After Storage

The above-prepared positive photoresist composition solution was coated on a silicon wafer and dried at 130° C. for 90 seconds, thereby a film having a film thickness of 0.20 μm was obtained. The thus-obtained wafer was subjected to exposure using an ArF eximer laser stepper (ArF exposure apparatus 9300, manufactured by ISI Co., Ltd.) having a resolving mask loaded, with varying the exposure amount, heated at 120° C. for 90 seconds in a clean room, development processed in a tetramethylammonium hydroxide developing solution (2.38 wt %) for 60 seconds, rinsed with distilled water and dried, thereby a pattern was obtained.

The sensitivity just after preparation of the coating solution of the positive photoresist composition (the minimum exposure amount to reproduce line and space pattern of 0.15 μm was taken as sensitivity) and the sensitivity after the composition solution was allowed to stand at 40° C. for one week were evaluated (in the similar manner to the above). Sensitivity fluctuation coefficient was evaluated by the following equation.

Sensitivity Fluctuation Coefficient (%)=|(sensitivity before storage)−(sensitivity after storage)|/(sensitivity before storage)×100

The results obtained are shown in Table 6 below.

TABLE 6

| Example No. | Development Defect | Adhering Property (nm) | Exposure Margin (%) | Sensitivity Fluctuation Coefficient (%) |
|---|---|---|---|---|
| Example 19 | 50 | 95 | 10 | <5 |
| Example 20 | 45 | 90 | 8 | <5 |
| Example 21 | 50 | 95 | 10 | <5 |
| Example 22 | 35 | 75 | 7 | <5 |
| Example 23 | 40 | 80 | 7 | <5 |
| Example 24 | 30 | 75 | 9 | <5 |
| Example 25 | 20 | 70 | 7 | <5 |
| Example 26 | 35 | 90 | 8 | <5 |
| Example 27 | 55 | 95 | 10 | <5 |
| Example 28 | 45 | 90 | 8 | <5 |
| Example 29 | 35 | 75 | 7 | <5 |
| Example 30 | 40 | 80 | 7 | <5 |
| Example 31 | 25 | 70 | 7 | <5 |
| Example 32 | 25 | 70 | 7 | <5 |
| Example 33 | 40 | 85 | 12 | <5 |
| Example 34 | 40 | 80 | 8 | <5 |
| Example 35 | 55 | 85 | 11 | <5 |
| Example 36 | 60 | 95 | 13 | 8 |
| Comparative Example 2 | 1,950 | 120 | 25 | 20 |

It can be understood from the results shown in Table 6 that the positive photoresist composition according to the present invention is excellent not only in the inhibition of occurring of development defects but in adhering property, exposure margin and the fluctuation of sensitivity after aging.

The present invention can provide a positive photoresist composition improved in an adhering property, an exposure margin and the fluctuations of sensitivity with the lapse of time in the manufacture of a semiconductor device. The present invention can also provide a positive photoresist composition excellent in storage stability and the inhibition of development defects.

While the invention has been described in detail and with reference to specific examples thereof, it will be apparent to one skilled in the art that various changes and modifications can be made therein without departing from the spirit and scope thereof.

What is claimed is:

1. A positive photoresist composition comprising:

(A) a resin containing a repeating structural unit represented by formula (I) below and at least one of repeating structural units represented by formulas (IIa), (IIb) and (IIc) below, the resin being capable of increasing the solubility in an alkali developer by the action of acid; and (B) a compound capable of generating an acid by irradiation with one of an actinic ray and radiation:

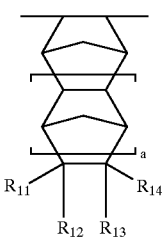

(I)

wherein $R_{11}$, $R_{12}$, $R_{13}$ and $R_{14}$ each represents a hydrogen atom or an alkyl group; and a represents 0 or 1;

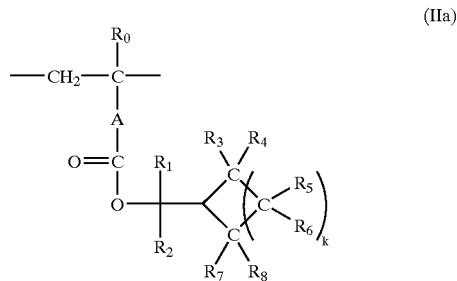

(IIa)

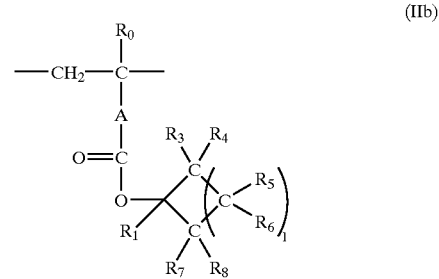

(IIb)

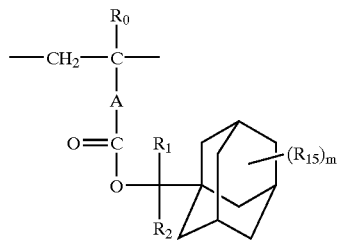

(IIc)

wherein $R_0$ represents a hydrogen atom or a lower alkyl group; A represents a single bond, or a group or combination of two or more groups selected from the group consisting of an alkylene group, a cycloalkylene group, an ether group, a thioether group, a carbonyl group and an ester group; $R_1$ and $R_2$ each represents a lower alkyl group; $R_3$, $R_4$, $R_5$, $R_6$, $R_7$ and $R_8$ each represents a hydrogen atom, a lower alkyl group, a lower alkoxyl group or a halogen atom; $R_3$ and $R_4$, or $R_5$ and $R_6$, may form a carbonyl group together; and $R_3$ and $R_5$ may be linked to form an alkylene chain; k and l each represents an integer of from 2 to 5; $R_{15}$ represents a lower alkyl group, a lower alkoxyl group or a halogen atom; and m represents an integer of from 0 to 3.

2. The positive photoresist composition as claimed in claim 1, wherein the resin (A) further contains a repeating structural unit represented by formula (III):

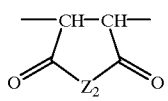

(III)

wherein $Z_2$ represents —O— or —N($R_{31}$)—; $R_{31}$ represents a hydrogen atom, a hydroxyl group, a haloalkyl group, or an —OSO$_2$—$R_{32}$ group; and $R_{32}$ represents an alkyl group, a haloalkyl group, a cycloalkyl group or a camphor residue.

3. The positive photoresist composition as claimed in claim 2, wherein the resin (A) comprises the repeating structural unit represented by formula (III) in an amount of from 20 to 80 mol % based on the entire repeating unit in the resin (A).

4. The positive photoresist composition as claimed in claim 1, wherein the resin (A) further contains a repeating structural unit represented by formula (IV):

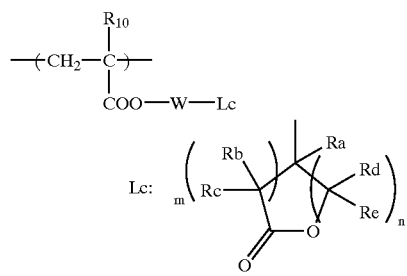

(IV)

wherein $R_{10}$ represents a hydrogen atom or a methyl group; W represents a single bond, or a group or combination of two or more groups selected from the group consisting of an alkylene group, an ether group, a thioether group, a carbonyl group and an ester group; Ra, Rb, Rc, Rd and Re each represents a hydrogen atom or an alkyl group having from 1 to 4 carbon atoms; and m and n each represents an integer of from 0 to 3, and m+n is from 2 to 6.

5. The positive photoresist composition as claimed in claim 4, wherein the resin (A) comprises the repeating structural unit represented by formula (IV) in an amount of from 1 to 30 mol % based on the entire repeating unit in the resin (A).

6. The positive photoresist composition as claimed in claim 1, wherein the resin (A) further contains a repeating structural unit represented by formula (V):

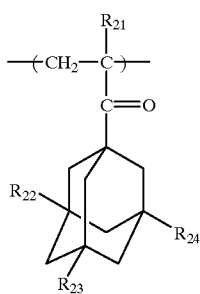

(V)

wherein $R_{21}$ represents a hydrogen atom, a halogen atom, or a straight chain or branched alkyl group having from 1 to 4 carbon atoms; $R_{22}$, $R_{23}$ and $R_{24}$ each represents a hydrogen atom or a hydroxyl group; and at least one of $R_{22}$, $R_{23}$ and $R_{24}$ represents a hydroxyl group.

7. The positive photoresist composition as claimed in claim 6, wherein the resin (A) comprises the repeating structural unit represented by formula (V) in an amount of from 1 to 30 mol % based on the entire repeating unit in the resin (A).

8. The positive photoresist composition as claimed in claim 1, wherein the compound (B) comprises at least one of compounds represented by formula (I'), (II') and (III') below, which are capable of generating a sulfonic acid by irradiation with one of an actinic ray and radiation:

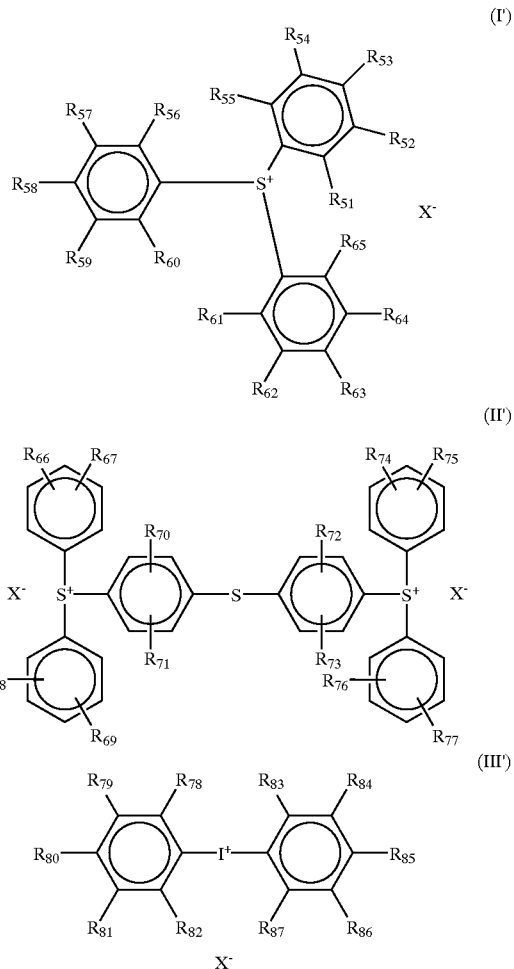

wherein $R_{51}$ to $R_{87}$, which are the same or different, each represents a hydrogen atom, a straight chain, branched or cyclic alkyl group, a straight chain, branched or cyclic alkoxyl group, a hydroxyl group, a halogen atom or an —S—$R_{88}$ group; $R_{88}$ represents a straight chain, branched or cyclic alkyl group or an aryl group; two or more of $R_{51}$ to $R_{65}$ may be bonded to form a ring containing at least one selected from a single bond, carbon, oxygen, sulfur and nitrogen; two or more of $R_{66}$ to $R_{77}$ may be bonded to form a ring containing at least one selected from a single bond, carbon, oxygen, sulfur and nitrogen; two or more of $R_{76}$ to $R_{87}$ may be bonded to form a ring containing at least one selected from a single bond, carbon, oxygen, sulfur and nitrogen; $X^-$ represents $R^FSO_3^-$; $R^F$ represents a straight chain, branched or cyclic alkyl group that has 2 or more carbon atoms and is substituted with at least one fluorine atom.

9. The positive photoresist composition as claimed in claim 8, wherein $R^FSO_3^-$ represents $CF_3(CF_2)_ySO_3^-$, and y represents an integer of from 1 to 15.

10. The positive photoresist composition as claimed in claim 8, which comprises the at least one of compounds represented by formula (I'), (II') and (III') in a total amount of from 0.001 to 20 wt % based on the entire solid content of the composition.

11. The positive photoresist composition as claimed in claim 1 which further comprises (D) an organic basic compound.

12. The positive photoresist composition as claimed in claim 1 which further comprises (E) a surfactant containing at least one of a fluorine atom and a silicon atom.

13. The positive photoresist composition as claimed in claim 1, wherein the resin (A) comprises the repeating structural unit represented by formula (I) in an amount of from 25 to 70 mol % based on the entire repeating unit in the resin (A).

14. The positive photoresist composition as claimed in claim 1, wherein the resin (A) comprises the at least one of repeating structural units represented by formula (IIa), (IIb) and (IIc) in a total amount of from 10 to 50 mol % based on the entire repeating unit in the resin (A).

15. The positive photoresist composition as claimed in claim 1, which comprises the resin (A) in an amount of from 40 to 99.99 wt % based on the entire solid content of the composition.

* * * * *